United States Patent
Hiramatsu

(10) Patent No.: US 11,798,968 B2
(45) Date of Patent: Oct. 24, 2023

(54) IMAGE PICKUP DEVICE AND ELECTRONIC APPARATUS

(71) Applicant: SONY SEMICONDUCTOR SOLUTIONS CORPORATION, Kanagawa (JP)

(72) Inventor: Katsunori Hiramatsu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 98 days.

(21) Appl. No.: 16/758,547

(22) PCT Filed: Oct. 26, 2018

(86) PCT No.: PCT/JP2018/039813
§ 371 (c)(1),
(2) Date: Apr. 23, 2020

(87) PCT Pub. No.: WO2019/093150
PCT Pub. Date: May 16, 2019

(65) Prior Publication Data
US 2020/0350345 A1  Nov. 5, 2020

(30) Foreign Application Priority Data
Nov. 9, 2017 (JP) ................................ 2017-216076

(51) Int. Cl.
*H01L 27/146* (2006.01)
(52) U.S. Cl.
CPC .... *H01L 27/1463* (2013.01); *H01L 27/14623* (2013.01); *H01L 27/14636* (2013.01)
(58) Field of Classification Search
None
See application file for complete search history.

(56) References Cited

U.S. PATENT DOCUMENTS 9,917,126 B1 * 3/2018 Lagrasta ........... H01L 27/14636
10,115,759 B2 * 10/2018 Lee .................. H01L 27/14636
(Continued)

FOREIGN PATENT DOCUMENTS

JP  2001-230400   8/2001
JP  2011-129633   6/2011
(Continued)

OTHER PUBLICATIONS

International Search Report and Written Opinion prepared by the Japanese Patent Office dated Jan. 15, 2019, for International Application No. PCT/JP2018/039813.
(Continued)

*Primary Examiner* — Nishath Yasmeen
(74) *Attorney, Agent, or Firm* — SHERIDAN ROSS P.C.

(57) ABSTRACT

The present technology relates to an image pickup device and electronic apparatus that enables suppression of dark current. There are included: a photoelectric conversion unit configured to perform a photoelectric conversion; a trench engraved in a semiconductor substrate; a negative fixed charge film having an oxide film, a nitrogen film, and an oxide film on a side wall of the trench; and an electrode film formed in the fixed charge film. The oxide film configuring the fixed charge film includes silicon monoxide (SiO), and the nitrogen film includes silicon nitride (SiN). The nitrogen film configuring the fixed charge film can also include a polysilicon film or a high dielectric constant film (high-k film). The present technology can be applied to, for example, a back-illuminated CMOS image sensor.

20 Claims, 20 Drawing Sheets

(56) References Cited

U.S. PATENT DOCUMENTS

| | | | | |
|---|---|---|---|---|
| 2001/0012133 | A1* | 8/2001 | Yoneda | H04N 1/195 |
| | | | | 257/E27.132 |
| 2011/0139962 | A1 | 6/2011 | Masaaki | |
| 2011/0156186 | A1* | 6/2011 | Iida | H01L 27/1463 |
| | | | | 257/E31.127 |
| 2012/0080733 | A1* | 4/2012 | Doan | H01L 27/1463 |
| | | | | 257/292 |
| 2014/0054662 | A1* | 2/2014 | Yanagita | H01L 27/1462 |
| | | | | 438/73 |
| 2014/0374868 | A1* | 12/2014 | Lee | H01L 27/14687 |
| | | | | 257/446 |
| 2015/0091121 | A1* | 4/2015 | Manda | H01L 27/1463 |
| | | | | 257/443 |
| 2015/0236058 | A1* | 8/2015 | Hu | H01L 27/14612 |
| | | | | 257/225 |
| 2015/0279878 | A1* | 10/2015 | Ahmed | H01L 27/14685 |
| | | | | 257/446 |
| 2016/0099278 | A1* | 4/2016 | Guyader | H01L 27/1203 |
| | | | | 257/432 |
| 2017/0047363 | A1* | 2/2017 | Choi | H01L 27/1464 |
| 2018/0301490 | A1* | 10/2018 | Dofuku | H01L 27/14 |

FOREIGN PATENT DOCUMENTS

| | | |
|---|---|---|
| JP | 2011-138905 | 7/2011 |
| JP | 2014-096490 | 5/2014 |
| JP | 2017-054890 | 3/2017 |
| JP | 2017-168566 | 9/2017 |
| WO | WO 2017/187957 | 11/2017 |

OTHER PUBLICATIONS

Extended European Search Report for European Patent Application No. 18875397.4, dated Nov. 20, 2020, 5 pages.

* cited by examiner

IMAGE PICKUP DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/039813 having an international filing date of 26 Oct. 2018, which designated the United States, which PCT application claimed the benefit of Japanese Patent Application No. 2017-216076 filed 9 Nov. 2017, the entire disclosures of each of which are incorporated herein by reference.

TECHNICAL FIELD

The present technology relates to an image pickup device and electronic apparatus, and relates to, for example, an image pickup device and electronic apparatus that can suppress dark current.

BACKGROUND ART

A complementary metal oxide semiconductor (CMOS) image sensor provided in a solid-state imaging device conventionally includes devices such as a photodiode and a transistor for each pixel. Moreover, a configuration including, between each pixel, deep trench isolation (DTI) that electrically isolates adjacent pixels, and a configuration including a sub-contact that conducts the static electricity charged in a pixel to the outside of the pixel have been proposed as the CMOS image sensor (refer to Patent Document 1).

If each pixel is provided with DTI and a sub-contact, a device formation area is reduced in each pixel. A configuration has been proposed which promotes an increase in device formation area in each pixel and discharges the static electricity charged in a pixel to the outside of the pixel (refer to Patent Document 2).

A solid-state imaging device in Patent Document 2 is configured including a photodiode, a pixel isolation portion, a conductive member, and an insulating film that covers a circumferential surface of the conductive member excluding a part on the other surface side of the conductive member. An end of the conductive member is connected to the ground.

CITATION LIST

Patent Document

Patent Document 1: Japanese Patent Application Laid-Open No. 2014-96490
Patent Document 2: Japanese Patent Application Laid-Open No. 2017-5490

SUMMARY OF THE INVENTION

Problems to be Solved by the Invention

It is also desired to suppress dark current in an image sensor.

The present technology has been made considering such circumstances, and is for enabling suppressing dark current.

Solutions to Problems

An image pickup device according to one aspect of the present technology includes: a photoelectric conversion unit configured to perform a photoelectric conversion; a trench engraved in a semiconductor substrate; a negative fixed charge film having an oxide film, a nitrogen film, and an oxide film on a side wall of the trench; and an electrode film formed in the fixed charge film.

An electronic apparatus according to one aspect of the present technology is equipped with the image pickup device.

In an image pickup device according to one aspect of the present technology, there are included: a photoelectric conversion unit configured to perform a photoelectric conversion; a trench engraved in a semiconductor substrate; a negative fixed charge film having an oxide film, a nitrogen film, and an oxide film on a side wall of the trench; and an electrode film formed in the fixed charge film.

In an electronic apparatus according to one aspect of the present technology, the image pickup device is equipped.

Effects of the Invention

According to one aspect of the present technology, it is possible to suppress dark current.

Incidentally, the effect described here is not necessarily limited, and any of the effects described in the present disclosure may be exerted.

MODE FOR CARRYING OUT THE INVENTION

A mode for carrying out the present technology (hereinafter referred to as the embodiment) is described hereinafter.

The present technology can be applied to an imaging device. Accordingly, a description is given here, taking, as an example, a case where the present technology is applied to an imaging device. Incidentally, the description is continued here taking the imaging device as an example. However, the present technology is not limited to the application to the imaging device, and can be applied to electronic apparatuses in general using an imaging device for an image capture unit (photoelectric conversion unit), for example, imaging devices such as digital still cameras and video cameras, mobile terminal apparatuses having an imaging function such as mobile telephone sets, copiers using an imaging device for an image reading unit, and the like. Incidentally, there is also a case where a module form mounted on an electronic apparatus, that is, a camera module, is assumed to be an imaging device.

Figure 1:
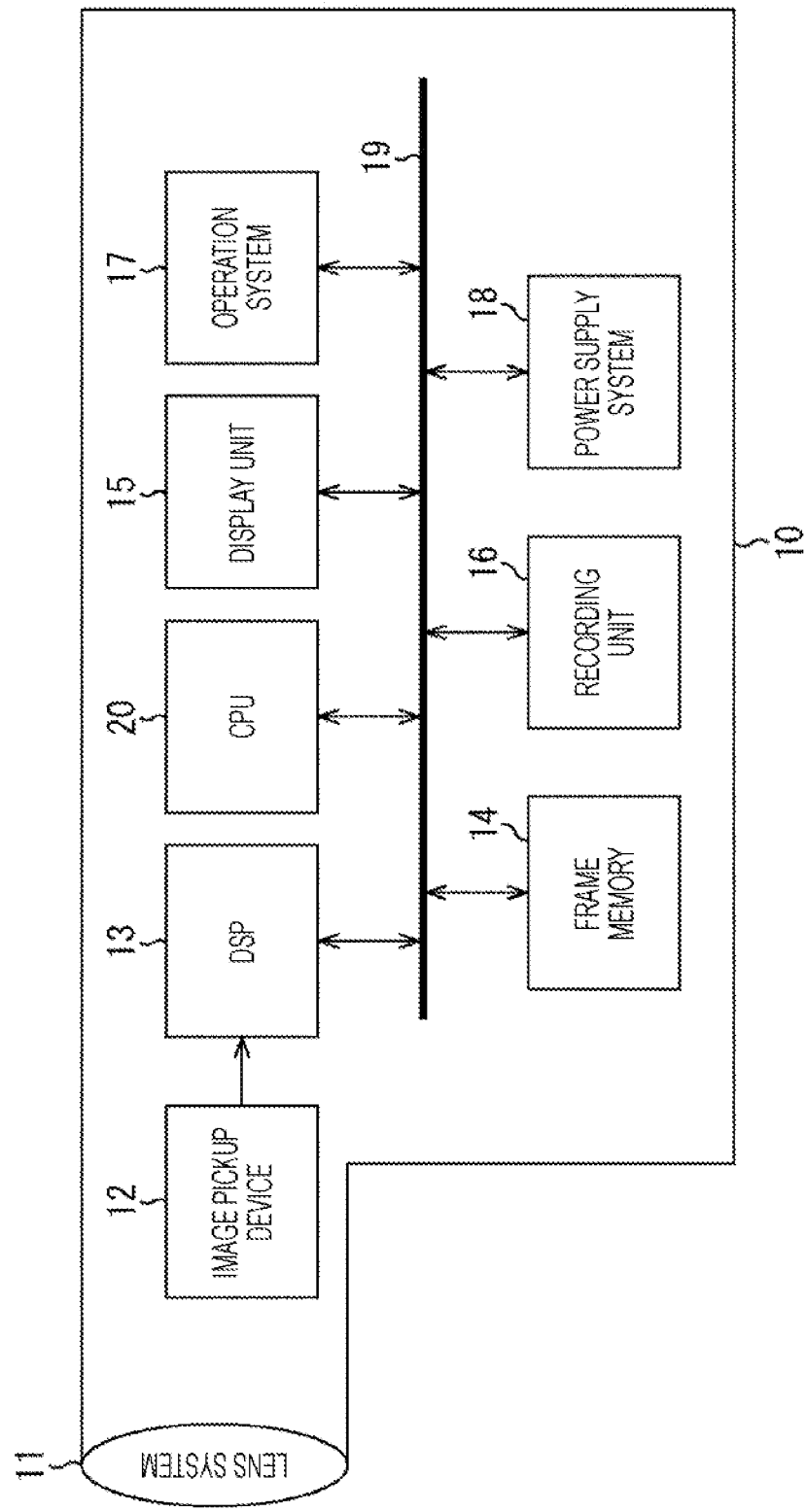
FIG. 1 is a diagram illustrating a configuration example of an imaging device.

FIG. 1 is a block diagram illustrating a configuration example of an imaging device being an example of an electronic apparatus of the present disclosure. As illustrated in FIG. 1, an imaging device 10 includes an optical system having a lens group 11 and the like, an image pickup device 12, a DSP circuit 13 being a camera signal processing unit, a frame memory 14, a display unit 15, a recording unit 16, an operation system 17, a power supply system 18, and the like.

In addition, it is configured in such a manner that the DSP circuit 13, the frame memory 14, the display unit 15, the recording unit 16, the operation system 17, and the power supply system 18 are connected to each other via a bus line 19. A CPU 20 controls each unit in the imaging device 10.

The lens group 11 captures incident light (image light) from a subject to form an image on an imaging surface of the image pickup device 12. The image pickup device 12 converts the amount of incident light that has been formed as an image by the lens group 11 on the imaging surface into an electrical signal, pixel by pixel, and outputs the electrical signal as a pixel signal. An image pickup device (image sensor) including pixels described below can be used as the image pickup device 12.

The display unit 15 includes a panel display unit such as a liquid crystal display unit or an organic electro luminescence (EL) display unit, and displays a moving image or a still image captured by the image pickup device 12. The recording unit 16 records the moving or still image captured by the image pickup device 12 in a recording medium such as a video tape or digital versatile disk (DVD).

The operation system 17 issues operation commands related to various functions of the present imaging device under operation by a user. The power supply system 18 appropriately supplies various powers being operating powers for the DSP circuit 13, the frame memory 14, the display unit 15, the recording unit 16, and the operation system 17 to these supply targets.

Configuration of Image Pickup Device

Figure 2:
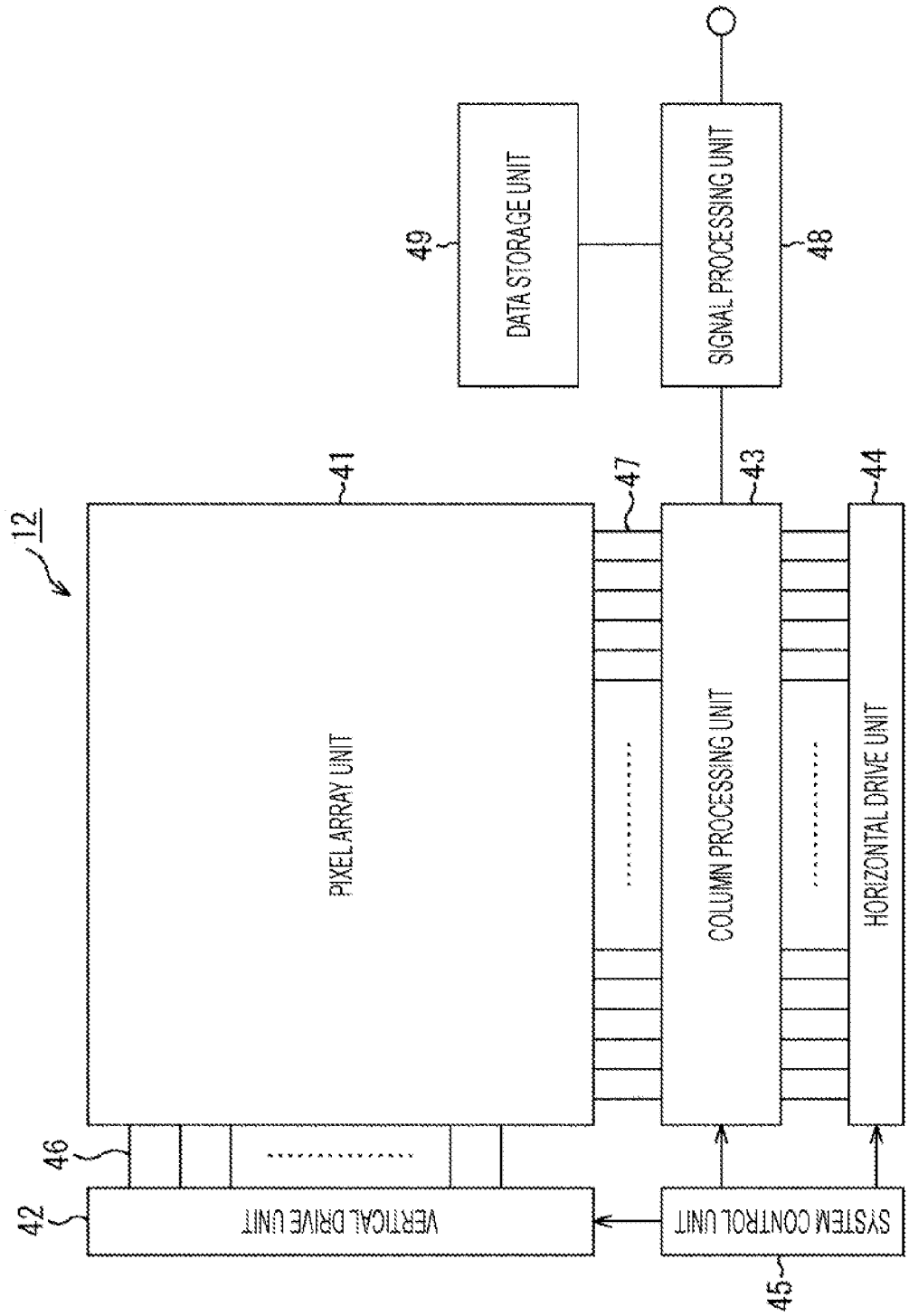
FIG. 2 is a diagram illustrating a configuration example of an image pickup device.

FIG. 2 is a block diagram illustrating a configuration example of the image pickup device 12. The image pickup device 12 can be a complementary metal oxide semiconductor (CMOS) image sensor.

The image pickup device 12 is configured including a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on an unillustrated semiconductor substrate (chip).

In the pixel array unit 41, unit pixels (for example, pixels 110 in FIG. 3) including a photoelectric conversion device that generates photocharge of the amount of charge in accordance with the amount of incident light and accumulates the photocharge inside are two-dimensionally placed in a matrix form. Incidentally, there are cases below where the photocharge of the amount of charge in accordance with the amount of incident light is simply described as "charge", and the unit pixel is simply described as "pixel."

Furthermore, in the matrix pixel arrangement in the pixel array unit 41, a pixel drive line 46 is formed for each row along a left-and-right direction (a pixel arrangement direction of a row of pixels) in the figure, and a vertical signal line 47 for each column along an up-and-down direction (a pixel arrangement direction of a column of pixels) in the figure. One end of the pixel drive line 46 is connected to an output end corresponding to each row of the vertical drive unit 42.

The image pickup device 12 further includes a signal processing unit 48 and a data storage unit 49. The signal processing unit 48 and the data storage unit 49 may be processing by an external signal processing unit provided to a different substrate from the image pickup device 12, for example, a digital signal processor (DSS) or software, or may be mounted on the same substrate as the image pickup device 12.

The vertical drive unit 42 includes a shift register, an address decoder, and the like, and is a pixel drive unit that drives pixels of the pixel array unit 41 all at once, row by row, or the like. Although the illustration of a specific configuration is omitted, the vertical drive unit 42 is configured including a readout scanning system and a sweep scanning system, or batch sweep and batch transfer.

The readout scanning system selects and scans the unit pixels of the pixel array unit 41 sequentially row by row to read signals from the unit pixels. In a case of row drive (a rolling shutter operation), in terms of sweep, a sweep scan is performed on a readout row where a readout scan is performed by the readout scanning system, preceding the readout scan by a length of time of the shutter speed. Moreover, in a case of global exposure (a global shutter operation), batch sweep is performed preceding batch transfer by a length of time of the shutter speed.

The sweep allows sweeping (resetting) unwanted charge from the photoelectric conversion devices in the unit pixels in the readout row. In addition, the sweep (reset) of the unwanted charge allows what is called an electronic shutter operation. The electronic shutter operation here indicates the operation of dumping the photocharge of the photoelectric conversion device and starting new exposure (starting accumulating photocharge).

The signal read by the readout operation by the readout scanning system corresponds to the amount of light entering after the immediately preceding readout operation or electronic shutter operation. In the case of row drive, a period from a readout timing of the immediately preceding readout operation or a sweep timing of the electronic shutter operation to a readout timing of the current readout operation is a photocharge accumulation period (exposure period) in the unit pixel. In the case of global exposure, a period from batch sweep to batch transfer is an accumulation period (exposure period).

The pixel signal outputted from each unit pixel in the pixel row selected and scanned by the vertical drive unit 42 is supplied to the column processing unit 43 through each of the vertical signal lines 47. For each pixel column of the pixel array unit 41, the column processing unit 43 performs predetermined signal processing on the pixel signal outputted from each unit pixel of the selected row through the vertical signal line 47, and temporarily holds the signal-processed pixel signal.

Specifically, the column processing unit 43 performs at least a noise reduction process, for example, a correlated double sampling (CDS; correlated double sampling) process as signal processing. Correlated double sampling by the column processing unit 43 allows reducing reset noise and fixed pattern noise unique to a pixel such as a variation in the threshold of an amplifier transistor. Incidentally, it is also possible to cause the column processing unit 43 to have, for example, an analog-to-digital (AD) conversion function other than the noise reduction process and output a signal level as a digital signal.

The horizontal drive unit 44 includes a shift register, an address decoder, and the like, and selects unit circuits corresponding to pixel rows of the column processing unit 43 sequentially. The select scan by the horizontal drive unit 44 allows outputting the pixel signals signal-processed by the column processing unit 43 sequentially to the signal processing unit 43.

The system control unit 45 includes a timing generator that generates various timing signals or the like, and controls the drive of, for example, the vertical drive unit 42, the column processing unit 43, the horizontal drive unit 44, and the like on the basis of various timing signals generated by the timing generator.

The signal processing unit 48 has at least an addition process function, and performs various types of signal processing such as an addition process on pixel signals outputted from the column processing unit 43. Upon signal processing in the signal processing unit 48, the data storage unit 49 temporarily stores data necessary for the processing.

Structure of Unit Pixel

Next, a description is given of a specific structure of the unit pixels 110 placed in a matrix form in the pixel array unit 41.

Figure 3:
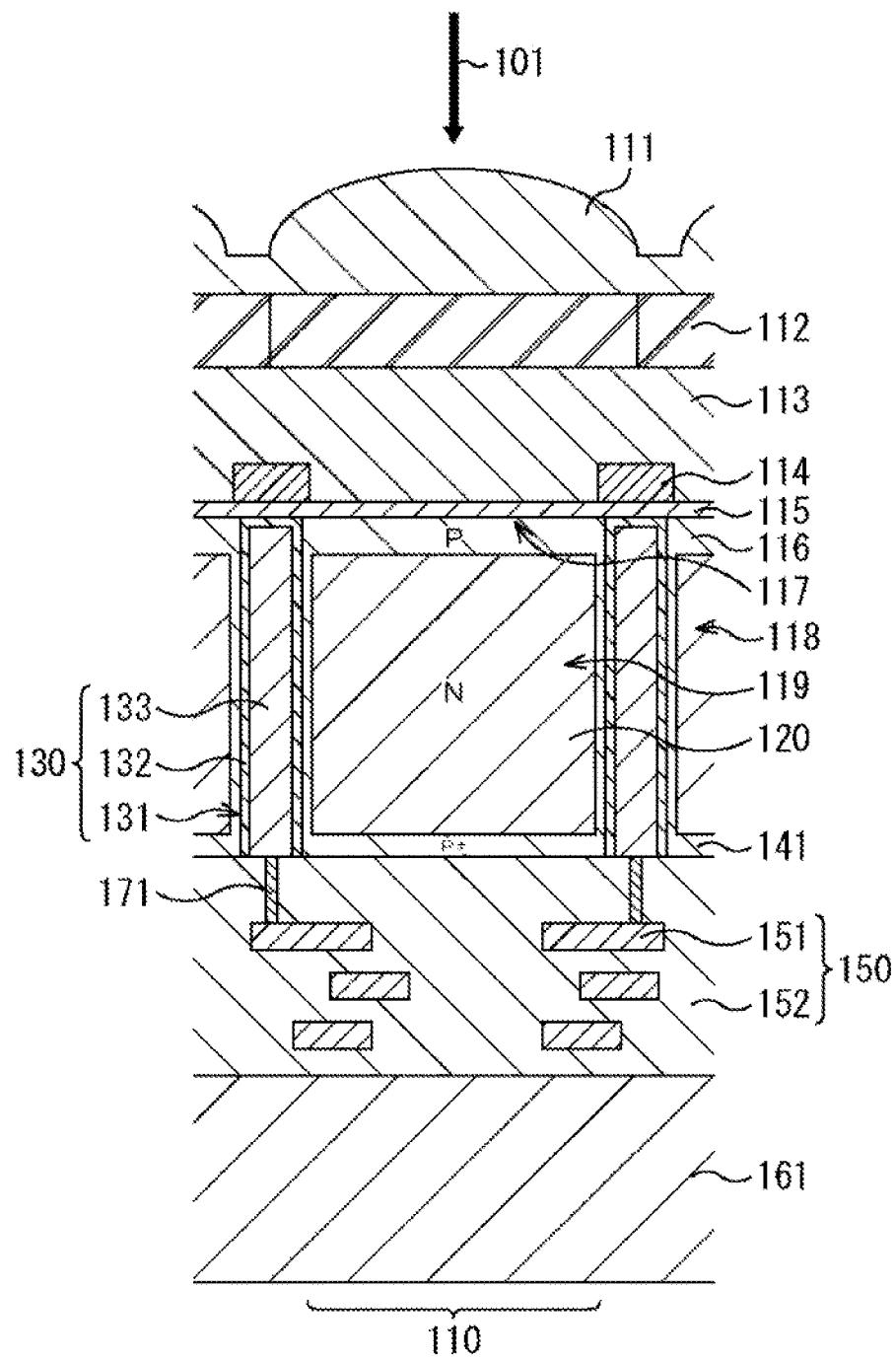
FIG. 3 is a virtual cross-sectional view illustrating a configuration example of a pixel to which the present technology is applied.

FIG. 3 is a cross-sectional view illustrating a configuration example of the solid-state imaging device to which the technology related to the present disclosure can be applied.

In the solid-state imaging device, a photodiode (PD) 119 configuring the pixel 110 receives incident light 101 that enters from a back surface (an upper surface in the figure) of a semiconductor substrate 118. A planarization film 113, a color filter (CF) 112, and a microlens 111 are provided above the PD 119. In the PD 119, the incident light 101 that has entered sequentially through each portion is received by a light receiving surface 117 to perform a photoelectric conversion.

For example, in the PD 119, an n-type semiconductor region 120 is formed as a charge accumulation region where charge (electrons) is accumulated. In the PD 119, the n-type semiconductor region 120 is provided inside p-type semiconductor regions 116 and 141 of the semiconductor substrate 118. The p-type semiconductor region 141 with higher concentration of impurities than the back surface (upper surface) side is provided on a front surface (lower surface) side of the semiconductor substrate 118 in the n-type semiconductor region 120. In other words, the PD 119 has a hole-accumulation diode (HAD) structure, and the p-type semiconductor regions 116 and 141 are formed at interfaces with the upper and lower surface sides of the n-type semiconductor region 120 so as to prevent generation of dark current.

A pixel isolation portion 130 that electrically isolates between a plurality of the pixels 110 is provided inside the semiconductor substrate 118. The PD 119 is provided in an area partitioned by the pixel isolation portion 130. As the solid-state imaging device is viewed from the upper surface side in the figure, the pixel isolation portions 130 are formed, for example, in a lattice form so as to be disposed between the plurality of the pixels 110. The PD 119 is formed within the area partitioned by the pixel isolation portion 130.

In each PD 119, the anode is grounded. In the solid-state imaging device, the signal charge (for example, electrons) accumulated in the PD 119 is read via, for example, an unillustrated transfer Tr (MOS FET) or the like, and is outputted as an electrical signal to an unillustrated vertical signal line (VSL).

A wiring layer 150 is provided on the front surface (lower surface) of the semiconductor substrate 118, the front surface being opposite to the back surface (upper surface) where the portions such as a light shielding film 114, the CF 112, and the microlens 111 are provided.

The wiring layer 150 includes wiring 151 and an insulating layer 152. In the insulating layer 152, the wiring 151 is formed so as to be electrically connected to each device. The wiring layer 150 is what is called a multilayer wiring layer, and is formed by stacking an interlayer insulating film configuring the insulating layer 152 and the wiring 151 alternately more than once. Here, wires such as a wire to a Tr for reading charge from the PD 119, such as the transfer Tr, and the VSL are stacked as the wiring 151 via the insulating layer 152.

A support substrate 161 is provided on a surface of the wiring layer 150, the surface being opposite to the side where the PD 119 is provided. For example, a substrate including a silicon semiconductor with a thickness of several hundred μm is provided as the support, substrate 161.

The light, shielding film 114 is provided on the back surface (upper surface in the figure) side of the semiconductor substrate 118.

The light shielding film 114 is configured to block part of the incident light 101 travelling from above the semiconductor substrate 118 to below the semiconductor substrate 118.

The light shielding film 114 is provided above the pixel isolation portion 130 provided inside the semiconductor substrate 118. Here, the light shielding film 114 is provided on the back surface (upper surface) of the semiconductor substrate 118 via an insulating film 115 such as a silicon oxide film so as to protrude in a convex form. In contrast, the light shielding film 114 is not provided above the PD 119 provided inside the semiconductor substrate 118, and opens so as to permit the incident light 101 to enter the PD 119.

In other words, as the solid-state imaging device is viewed from the upper surface side in the figure, a planar shape of the light shielding film 114 is a lattice form, and an opening through which the incident light 101 passes to the light receiving surface 117 is formed.

The light shielding film 114 includes a light shielding material that blocks light. For example, a titanium (Ti) film and a tungsten (W) film are stacked in turn to form the light shielding film 114. In addition, the light shielding film 114 can also be formed by stacking, for example, a titanium nitride (TiN) film and a tungsten (W) film in turn. Moreover, the light shielding film 114 may be covered with nitride (N) and the like.

The light shielding film 114 is covered with the planarization film 113. The planarization film 113 is formed using an insulating material that transmits light.

The pixel isolation portion 130 includes a trench 131, a fixed charge film 132, and an electrode film 133.

The fixed charge film 132 is formed on the back surface (upper surface) side of the semiconductor substrate 118 so as to cover the trench 131 that partitions between the plurality of the pixels 110.

Although the details are described below with reference to FIG. 6, the fixed charge film is assumed to have a three-layer structure, and is provided so as to cover an inner surface of the trench 131 formed on the front surface (lower surface) side in the semiconductor substrate 118, with a constant thickness. The electrode film 133 is then provided (filled) so as to bury the inside of the trench 131 covered with the fixed charge film 132.

Here, the fixed charge film 132 is formed using a high-k dielectric having fixed negative charge so as to form a positive charge (hole) accumulation region in a portion of an interface with the semiconductor substrate 118 and prevent the occurrence of dark current. The fixed charge film 132 is formed so as to include fixed negative charge. Accordingly, the fixed negative charge allows applying an electric field to the interface with the semiconductor substrate 119. Therefore, the positive charge (hole) accumulation region is formed.

Figure 4:
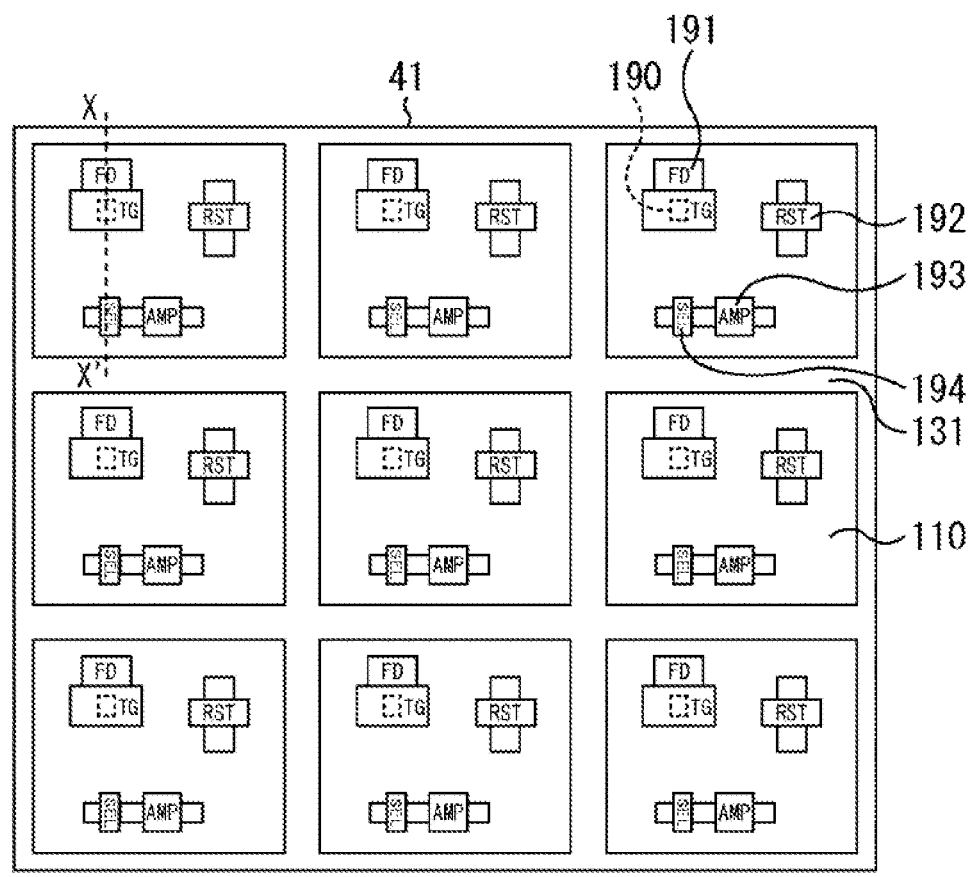
FIG. 4 is a plan view of a front surface side of the pixels to which the present technology is applied.
Figure 5:
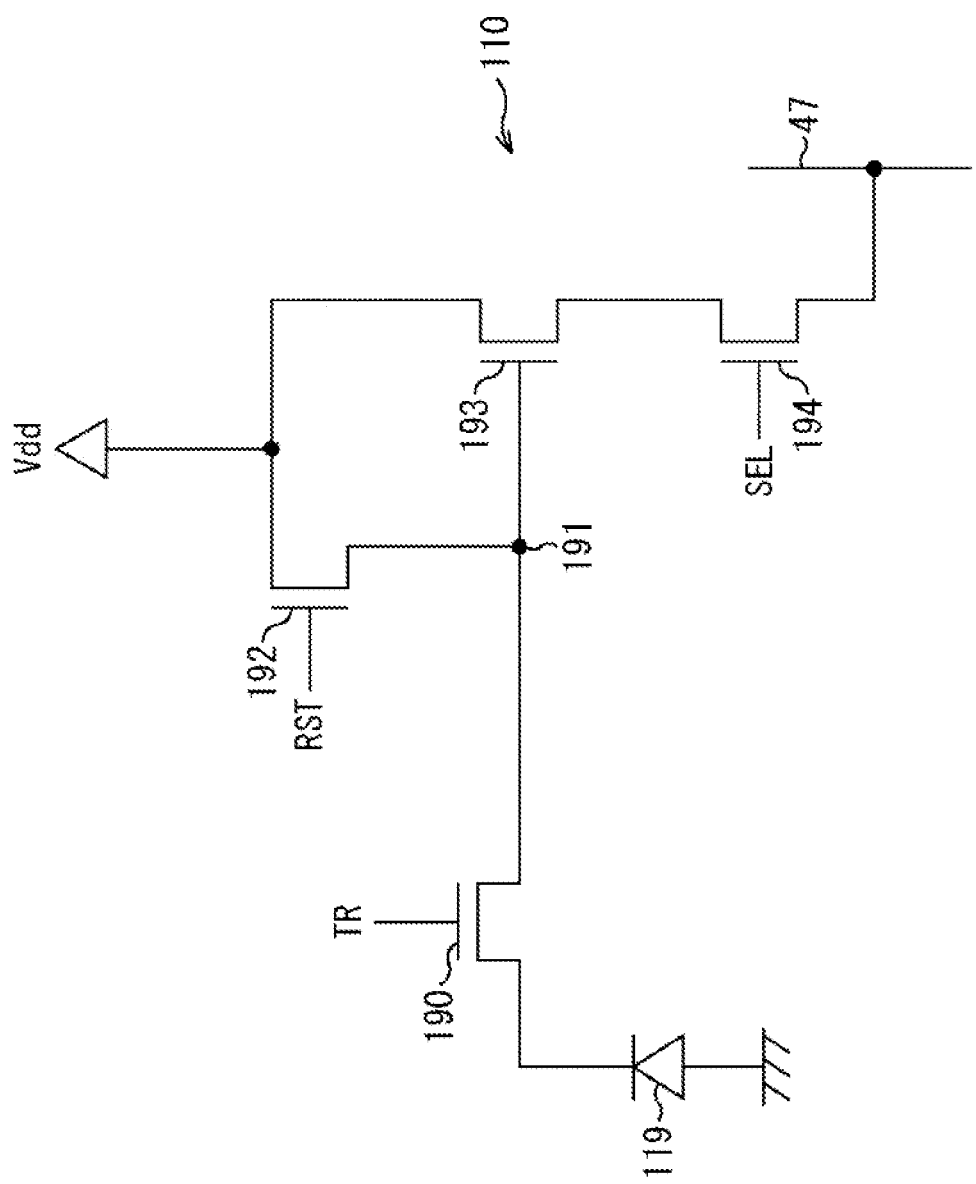
FIG. 5 is a circuit diagram of the pixel.

The placement of transistors formed in the pixel 110 and the operation of each transistor are described with reference to FIGS. 4 and 5. FIG. 4 is a plan view of nine pixels 110 of 3×3 placed in the pixel array unit 41 (FIG. 2) as viewed from the front surface side (the upper side in the figure in FIG. 3). FIG. 5 is a circuit diagram for explaining the connection relationship of each transistor illustrated in FIG. 4.

In FIG. 4, one rectangle represents one pixel 110. As illustrated in FIG. 4, the trench 131 is formed so as to surround the pixel 110 (the PD 119 included in the pixel 110). Moreover, a transfer transistor (gate) 190, a floating diffusion (FD) 191, a reset transistor 192, an amplifier transistor 193, and a select transistor 194 are formed on the front surface side of the pixel 110.

The PD 119 generates and accumulates charge (signal charge) in accordance with the amount of light received. The PD 119 has an anode terminal grounded, and has a cathode terminal connected to the FD 191 via the transfer transistor 190.

When turned on by a transfer signal TR, the transfer transistor 190 reads the charge generated in the PD 190 and transfers the charge to the FD 191.

The FD 191 holds the charge read from the PD 190. When turned on by a reset signal RST, the reset transistor 192 resets the potential of the FD 191 by discharging the charge accumulated in the FD 191 to a drain (a constant voltage source Vdd).

The amplifier transistor 193 outputs a pixel signal in accordance with the potential of the FD 191. In other words, the amplifier transistor 193 configures a source follower with a load MOS (not illustrated) as a constant current source connected via a vertical signal line 33. The amplifier transistor 133 outputs a pixel signal indicating a level in accordance with the charge accumulated in the FD 191 to the column processing unit 43 (FIG. 2) via the select transistor 194 and the vertical signal line 47.

The select transistor 194 is turned on when a pixel 31 is selected by a select signal SEL, and outputs a pixel signal of the pixel 31 to the column processing unit 43 via the vertical signal line 33. Each of the signal lines where the transfer signal TR, the select signal SEL, and the reset signal RST are transmitted corresponds to the pixel drive line 46 in FIG. 2.

The pixel 110 can be configured as described above, but is not limited to this configuration and can employ another configuration.

Configuration of Fixed Charge Film

Figure 6:
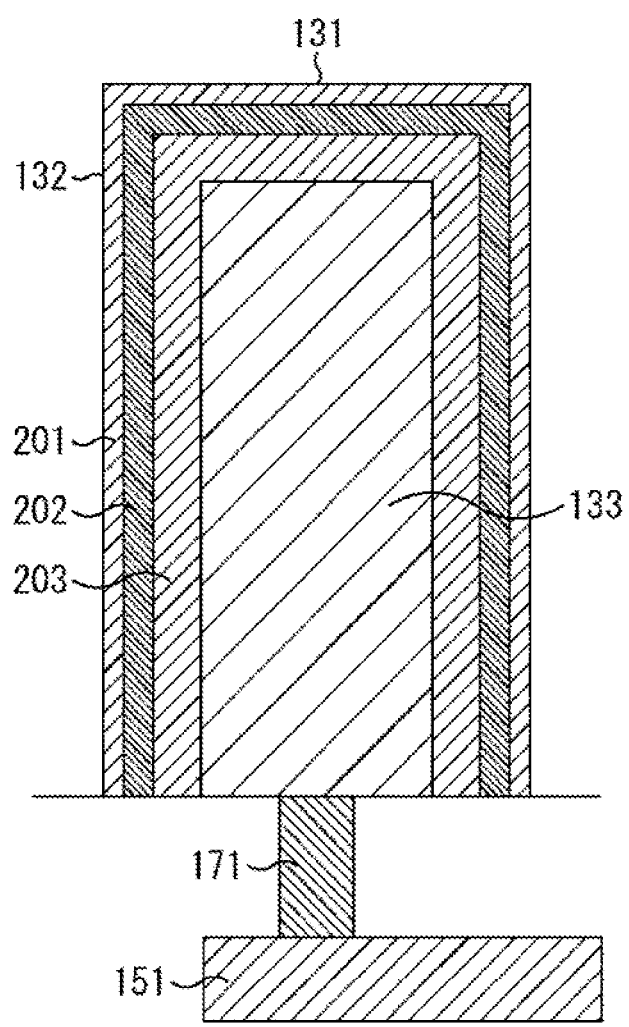
FIG. 6 is a diagram for explaining the configuration of a fixed charge film.

FIG. 6 is a diagram illustrating a derailed configuration of the fixed charge film 132.

The fixed charge film 132 is provided so as to cover the inner surface of the trench 131 formed on the front surface (lower surface in the figure) side in the semiconductor substrate 118, with a constant thickness. The electrode film 133 is then provided (filled) so as to bury the inside of the trench 131 covered with the fixed charge film 132.

The fixed charge film 132 is formed in the pixel isolation portion 130, and is formed with a three-layer structure. The three layers configuring the fixed charge film 132 include a silicon monoxide (SiO) film 201, a silicon nitride (SiN) film 202, and an SiO film 203. In this manner, the fixed charge film 132 is configured in such a manner that the SiN film is sandwiched between the SiO films. The fixed charge film 132 has a similar configuration to a charge accumulation film including an accumulation film of oxide film-nitrogen film-oxide film (an ONO film).

It is possible to cause t the fixed charge film 132 to function as the charge accumulation film. The electrode film 133 is formed on the inner side of the fixed charge film 132. A voltage is applied to the electrode film 133; accordingly, the fixed charge film 132 functions as a negative fixed charge film. A contact 171 is connected to the electrode film 133. The contact 171 is connected to the wiring 151 in the wiring layer 150. The wiring 151 is connected to a power supply, and is configured in such a manner that a predetermined voltage is applied thereto at a predetermined timing.

The number of times when the voltage is applied to the fixed charge film 132 may be one. For example, it may be configured in such a manner that the voltage is applied once upon fabrication of the pixel 110.

Moreover, it may be configured in such a manner that the voltage is applied to the fixed charge film 132 at a timing when the power to the imaging device including the pixel 110 is turned on. In a case of such a configuration, it may be configured in such a manner that the voltage is applied to the fixed charge film 132 whenever the power to the imaging device is turned on.

If the voltage is applied to the fixed charge film 132 even once, the fixed charge film 132 starts functioning as a charge film having fixed negative charge. The fixed negative charge allows applying an electric field to the interface with the semiconductor substrate 118. Accordingly, the positive charge (hole) accumulation region is formed, and it is possible to have the configuration where the occurrence of dark current is prevented.

In this manner, it is possible to cause the fixed charge film 132 to function as the negative fixed charge film 132 by applying the voltage thereto at least once. Accordingly, the negative fixed charge film 132 can be generated without power consumption.

The SiO film 201, the SiN film 202, and the SiO film 203, which configure the fixed charge film 132, may be formed With the same thickness, or with different thicknesses. Moreover, the thicknesses of the SiO films 201 and 201 may be formed the same, and the thickness of the SiO film 201 on the PD 119 side may be formed thinner than the SiO film 203 on the inner side of the fixed charge film 132.

Figure 7:
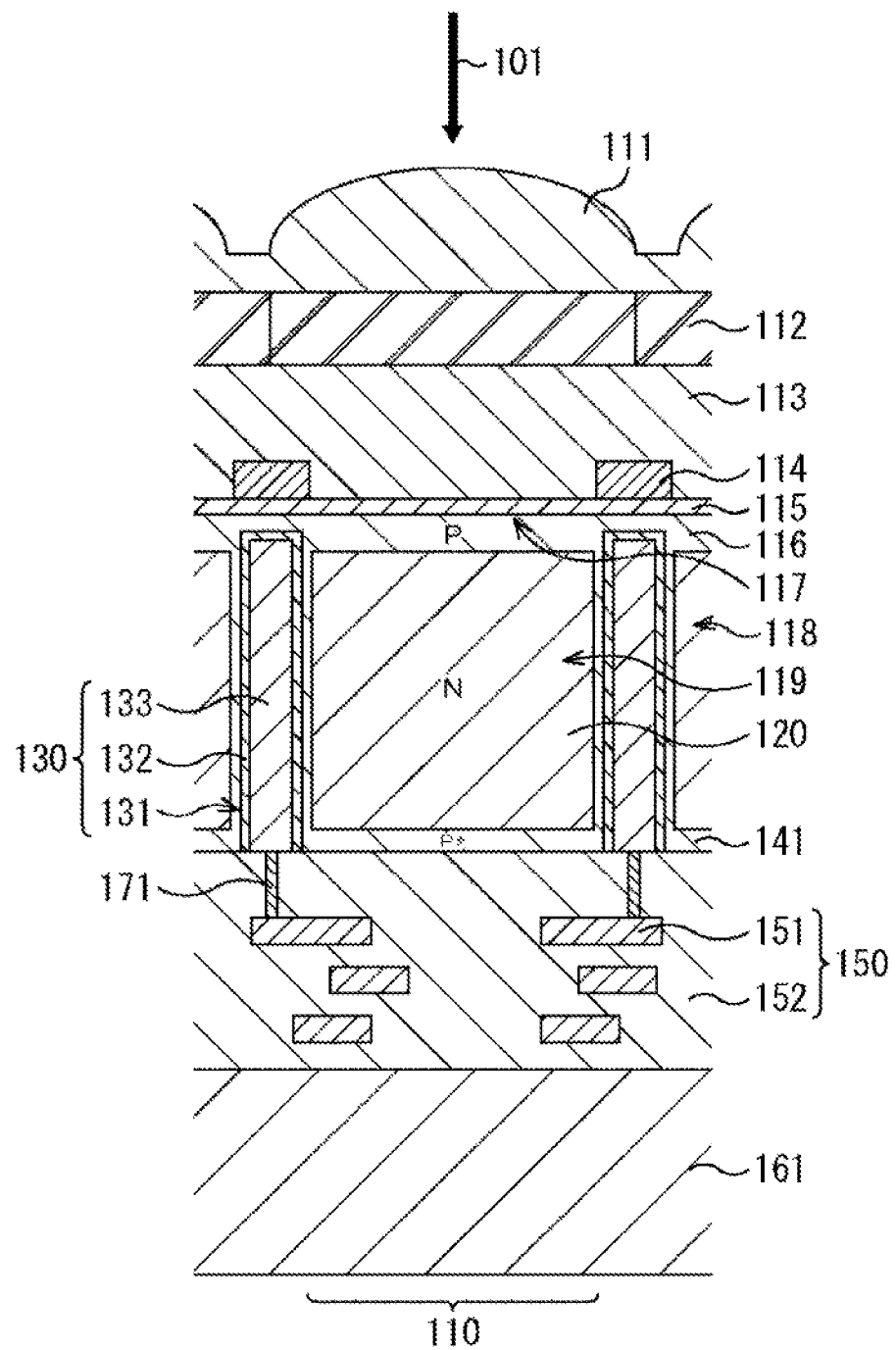
FIG. 7 is a vertical cross-sectional view illustrating another configuration example of the pixel.

The fixed charge film 132 may be formed up to a position where an upper portion of the fixed charge film 132 is in contact with the insulating film 115 as illustrated in FIG. 3, or may be formed up to a position where the upper portion is not in contact with the insulating film 115 as illustrated in FIG. 7. A pixel 110' illustrated in FIG. 7 has a structure where the p-type semiconductor region 116 is present between the upper portion of the fixed charge film 132 and the insulating film 115, and the upper portion of the fixed charge film 132 is not in contact with the insulating film 115.

As illustrated in FIG. 7, the trench 131 may be formed in a state of not penetrating the semiconductor substrate 118. Also in this case, the fixed charge film 132 is formed in the trench 131; accordingly, it is possible to have a configuration where the occurrence of dark current is prevented as in the case illustrated in FIG. 3 where the trench 131 is formed in the state of penetrating the semiconductor substrate 118.

In terms of the pixel 110 illustrated in FIG. 3 and the pixel 110' illustrated in FIG. 7, the case is illustrated in which the contact 171 is formed on the front surface side (the side opposite to the light incident side; the lower side in the figure). However, the contact 171 may be formed on the back surface side (the light incident side; the upper side in the figure).

Figure 8:
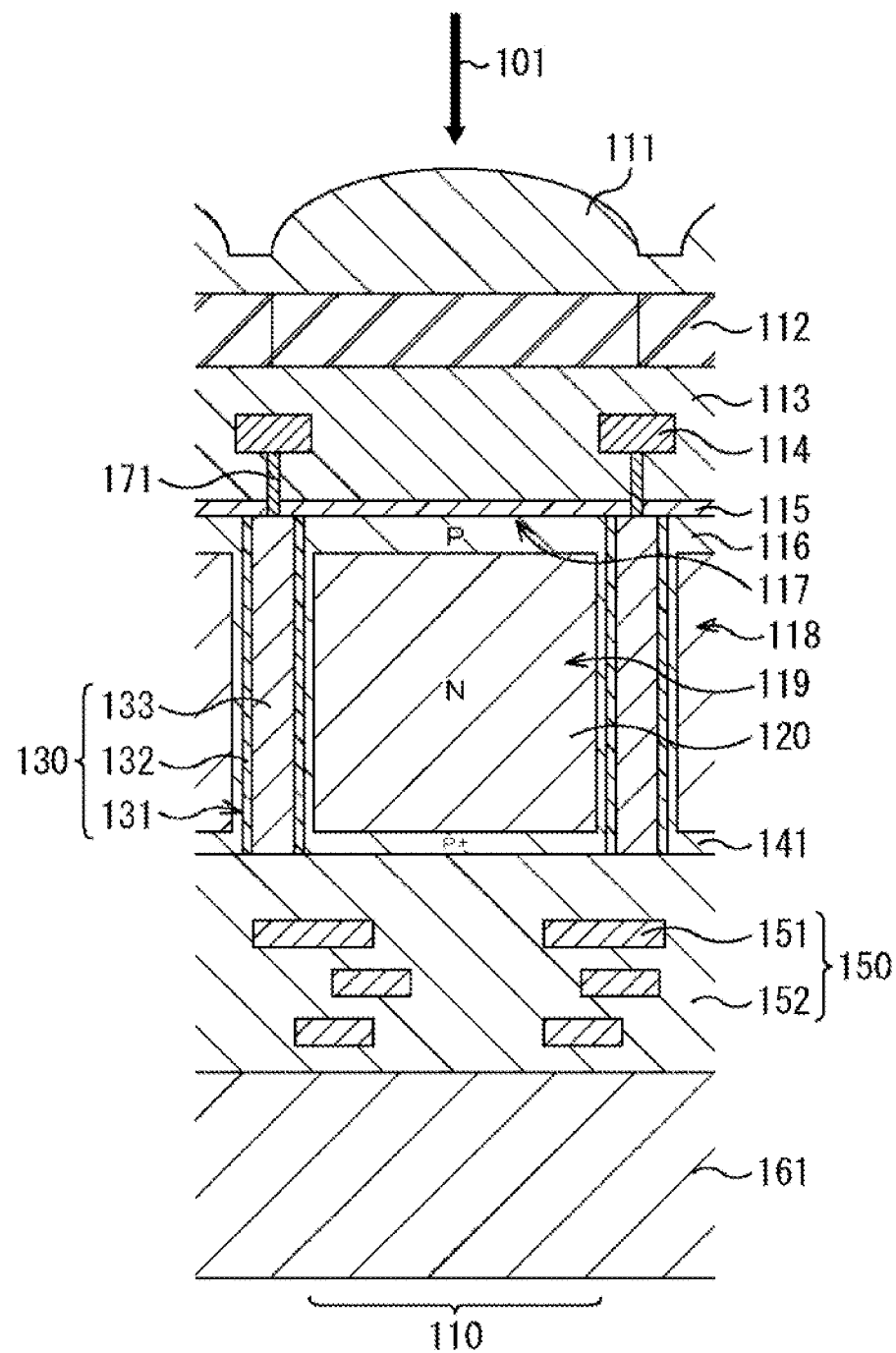
FIG. 8 is a vertical cross-sectional view illustrating still another configuration example of the pixel.

FIG. 8 illustrates the configuration of a pixel 110" where a contact 171" is formed on the back surface side. As illustrated in FIG. 3, the contact 171" is formed on the back surface side (light incident side). One end is connected to the electrode film 133, and the other end is connected to the light shielding film 114.

The light shielding film 114 includes a material that blocks light, and can include an electrical conductor such as metal. The light shielding film 114 includes an electrical conductor, and it is configured in such a manner that a predetermined voltage is applied to the light shielding film 114. Accordingly, it is possible to apply the voltage to the electrode film 133 connected to the light shielding film 114 via the contact 171".

The contact 171 may be configured to be connected to the wiring 151 in the wiring layer 150, or may be configured to be connected to the light shielding film 114.

Figure 9:
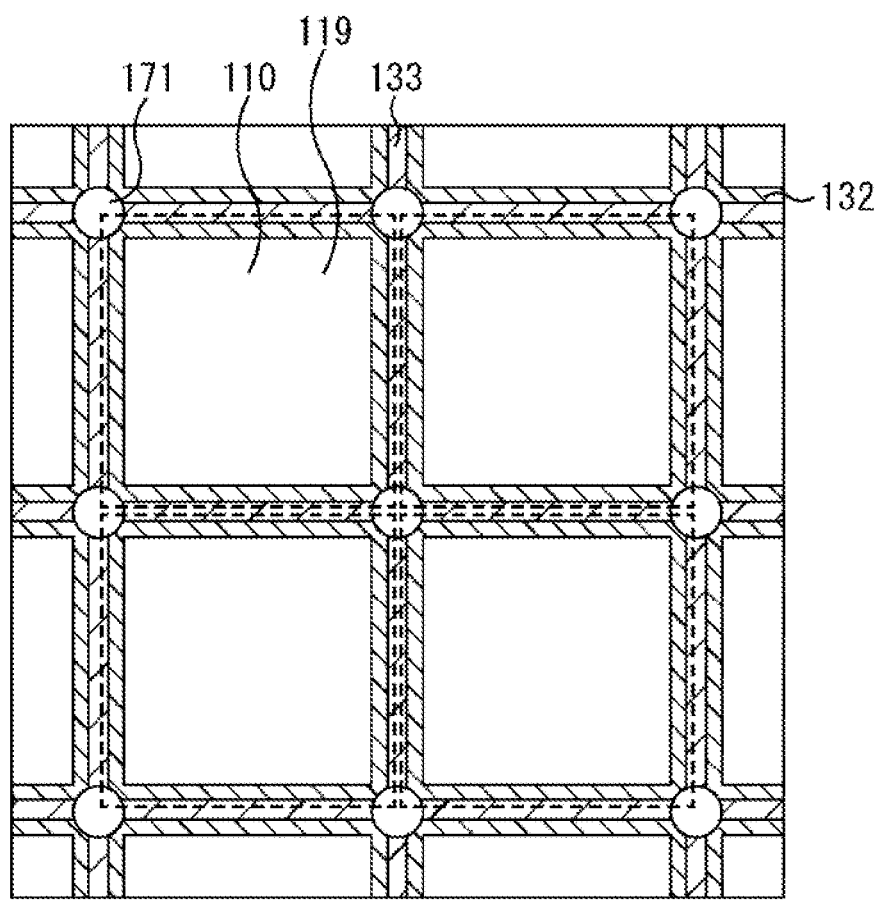
FIG. 9 is a diagram for explaining the placement of contacts.
Figure 10:
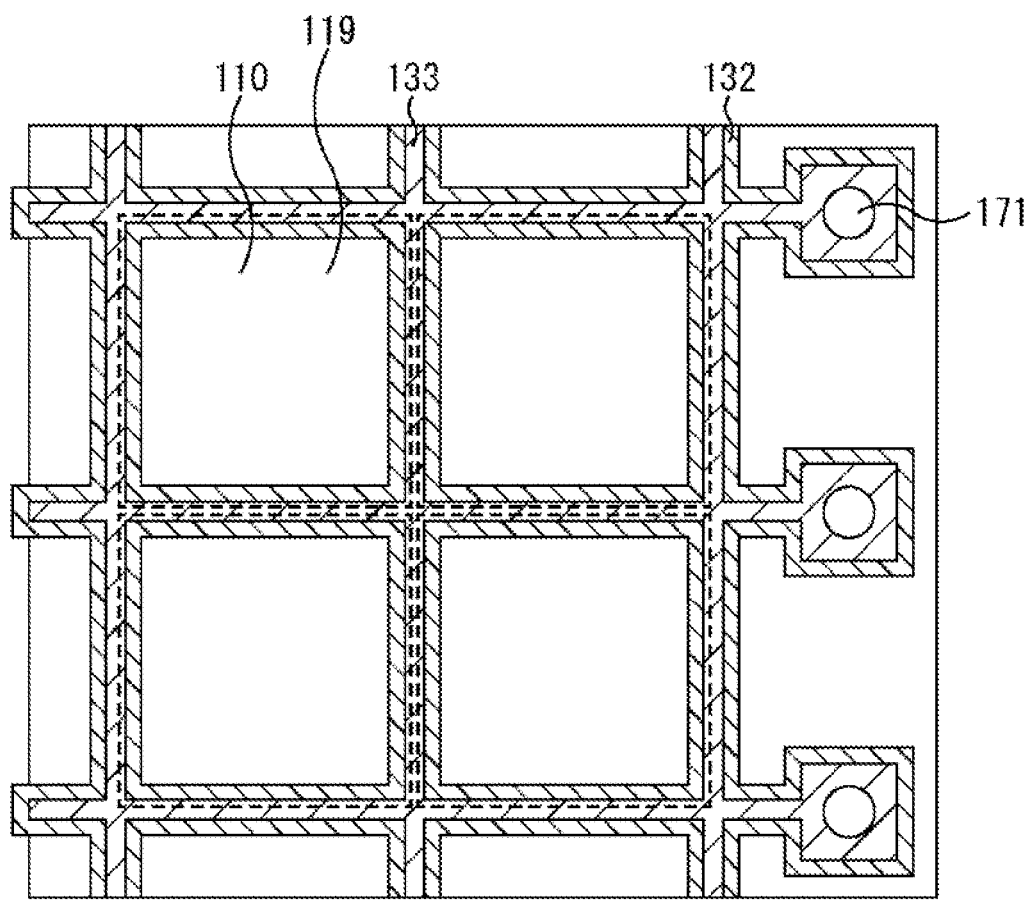
FIG. 10 is a diagram for explaining the placement of the contacts.

Moreover, the contacts 171 can be configured to be formed in the positions and number illustrated in FIG. 9 or 10. FIG. 9 illustrates a case where the contact 171 is placed for each pixel 110. FIG. 10 illustrates a configuration where the contact 171 is shared by a plurality of the pixels 110. FIGS. 9 and 10 are plan views as viewed from, for example, the back surface side (lower side) of the pixels 110 illustrated in FIG. 3.

FIG. 9 illustrates four pixels 110 of a 2×2 array placed in the pixel array unit 41 (FIG. 2). One pixel 110 (PD 119) is surrounded by the trench 131. The fixed charge film 132 is formed in the trench 131. Accordingly, one PD 119 is configured to be surrounded by the fixed charge film 132.

The contact 171 is formed at each of four corners of one pixel 110. The contacts 171 formed respectively at the four corners of the pixel 110 are connected to the wiring 151 (FIG. 3). The wiring 151 is connected to a power supply voltage.

With reference again to the cross-sectional view of the pixel 110 illustrated in FIG. 3, the electrode film 133 is formed in the trench 131. Moreover, with reference to the plan view of the pixel 110 illustrated in FIG. 9, the electrode film 133 is formed so as to surround the pixel 110, and the electrode film 133 formed around each pixel 110 is formed continuously to the electrode film 133 formed around an adjacent pixel 110. In other words, the electrode film 133 formed in the pixel array unit 41 is formed continuously and unbrokenly.

Hence, as illustrated in FIG. 9, the contact 171 may be formed for each pixel 110, but may be formed for each group of a plurality of the pixels 110 as illustrated in FIG. 10. In terms of the pixel 110 illustrated in FIG. 10, it is configured in such a manner that a plurality of pixels 110 arranged in a row direction shares one contact 171. Moreover, the contact 171 is provided at an end of the pixel array unit 41.

FIG. 10 illustrates the configuration where the plurality of the pixels 110 arranged in the row direction shares one contact 171. However, as described above, the electrode film 133 formed in the pixel array unit 41 is continuously formed. Accordingly, it is also possible to be configured in such a manner that all the pixels 110 of the pixel array unit 41 share one contact 171. For example, three contacts 171 are depicted in FIG. 10. However, although not illustrated, it is also possible to have, for example, a structure where only the contact 171 depicted at the top is formed.

Moreover, in the structures in FIGS. 9 and 10, each pixel 110 is surrounded by the trench 131 (the fixed charge film 132 and the electrode film 133, which are formed in the trench 131). However, as illustrated in FIG. 11, it is also possible to be configured in such a manner that the pixel 110 is surrounded not completely but partially by the trench 131.

Figure 11:
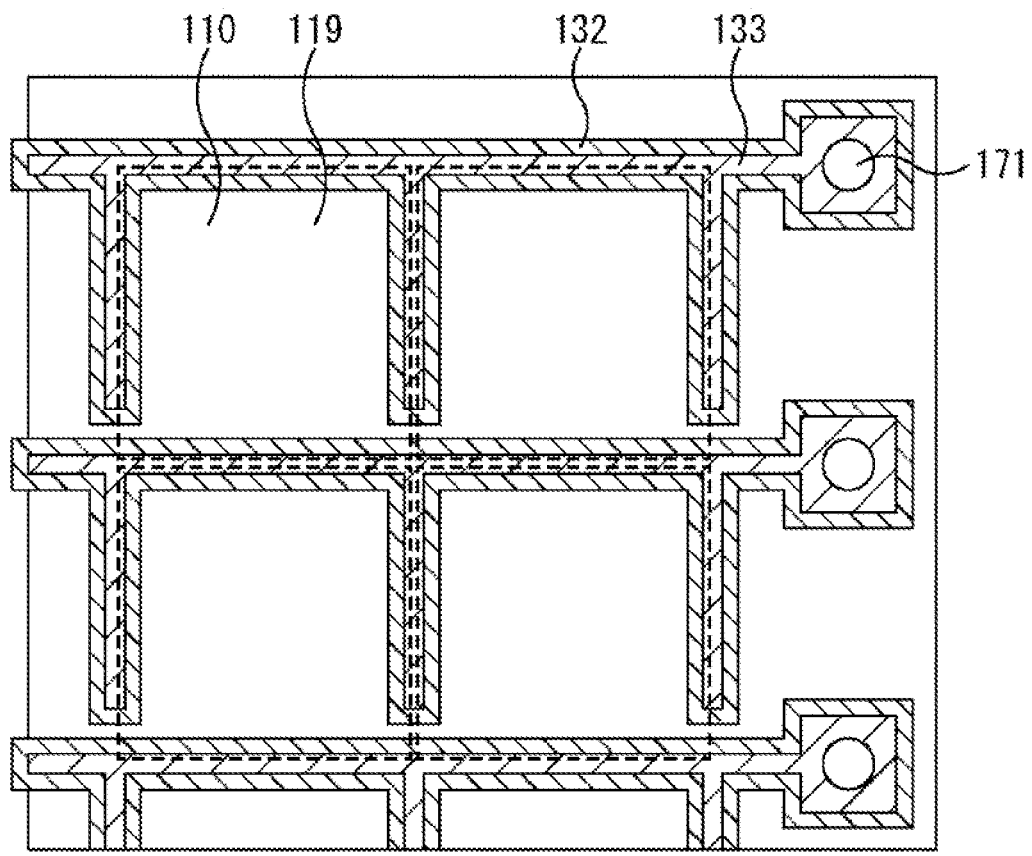
FIG. 11 is a diagram for explaining the placement of the contacts.

If, as in the pixel 110 illustrated in FIGS. 9 and 10, the configuration where the trench 131 is formed so as to completely surround the perimeter of the pixel 110, that is, the configuration where the pixel isolation portion 130 is formed so as to completely surround the perimeter of the pixel 110, is described as complete pixel isolation, the pixel 110 illustrated in FIG. 11 has a structure which is not complete pixel isolation.

Three of four sides of the pixel isolation portion 130 (the electrode film 133 in the trench 131) surrounding the pixel 110 illustrated in FIG. 11 are continuously formed but the remaining one side is not connected. One contact 171 is connected to the three sides formed continuously. In the example illustrated in FIG. 11, it is configured in such a manner that a plurality of the pixels 110 arranged in the row direction shares one contact 171.

As in the examples illustrated in FIGS. 9 and 10, all the pixel isolation portions 130 (the electrode films 133) in the pixel array unit 41 may be formed in the connected state, or as in the example illustrated in FIG. 11, all the electrode films 133 in the pixel array unit 41 may be formed not in the connected state but in the partially cut shape. Moreover, it is simply required to appropriately set the number of the contacts 171, positions where the contacts 171 are formed, and the like, depending on whether the electrode film 133 is formed continuously or discontinuously, or whether the same voltage is applied to all the pixels, different voltages are applied individually (to a predetermined number), or the like.

Regarding Fabrication of Pixel

Figure 12:
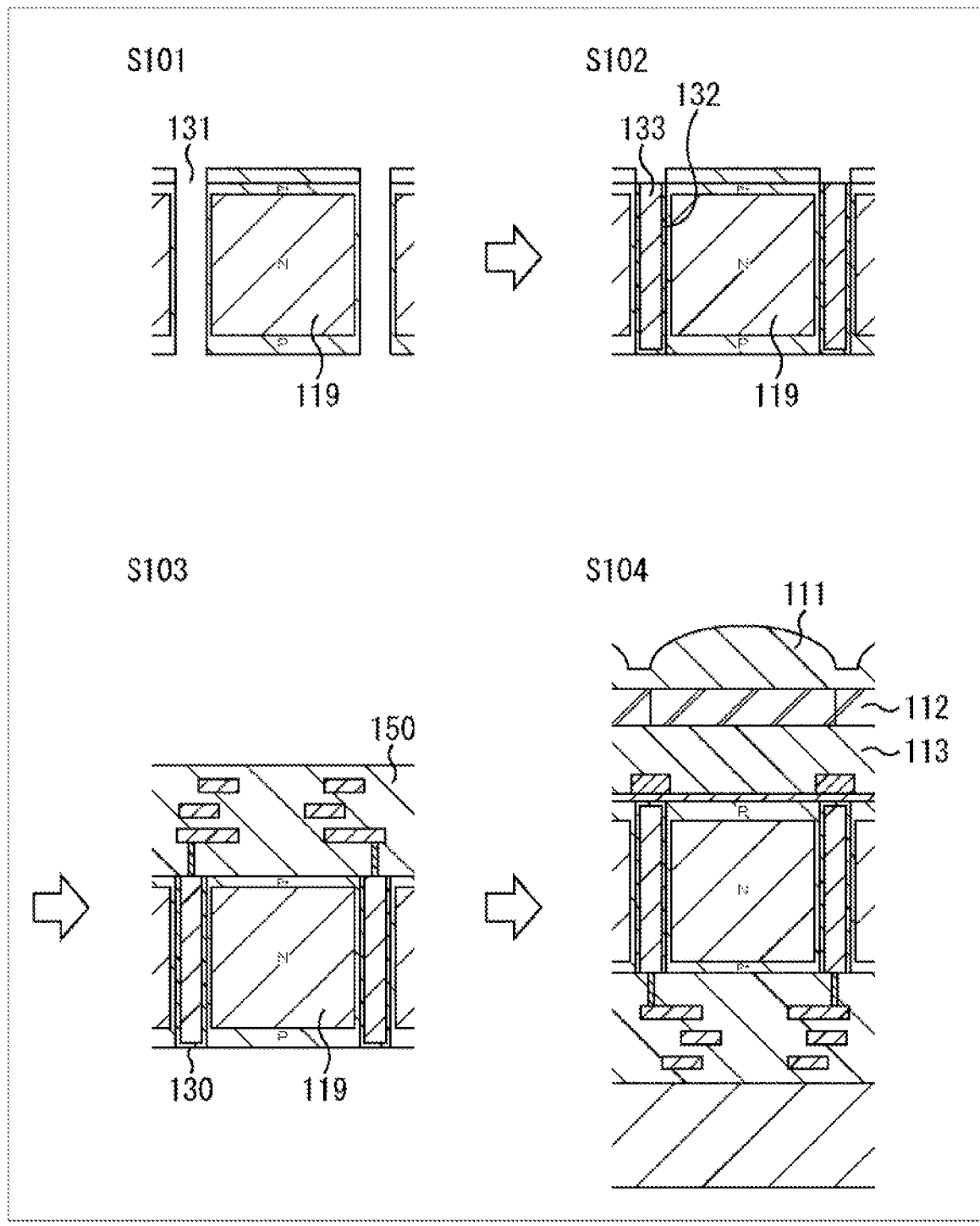
FIG. 12 is a diagram for explaining the fabrication of the pixel.

A description is added to the fabrication of the pixel 110 with reference to FIG. 12.

In step S101, the front end of line (FEOL) is executed. In the FEOL, devices of transistors (for example, the transfer transistor 190 (FIG. 4) and the like) are formed on the front surface side of the pixel 110. Moreover, in step S101, the PD 119 and the like are also formed in the semiconductor substrate 118. Furthermore, in step S101, the trench 131 is also formed. The trench 131 can be formed by lithography and dry etching.

In step S102, the fixed charge film 132 is deposited, and the electrode film 133 is deposited. As described above, the fixed charge film 132 includes the SiO film 201, the SiN film 202, and the SiO film 203, which are deposited in this order. The electrode film 133 is then deposited (a material forming the electrode film 133 is filled).

After the deposition, etching back is performed to form a MONOS structure. The MONOS structure is a metal-oxide-nitride-oxide-silicon structure, and is a structure where three layers of an oxide film/a nitride film/an oxide film (corresponding to the fixed charge film 132 in this case) is formed on a silicon substrate, and an electrode (metal; corresponding to the electrode film 133 in this case) is placed on the three layers.

As the material forming the electrode film 133, metal, for example, tungsten (W), polysilicon, or the like can be used. Moreover, the description has been given here assuming the SiO film 201, the SiN film 202, and the SiO film 203 to be the fixed charge film 132. However, the ONO film may include a combination of materials other than SiO and SiN. For example, the SiN film 202 (the nitride film) may not be SiN but can also include a polysilicon (Poly-Si) film or a high dielectric constant film (high-k film).

If the SiN film 202 is assumed to be a high-k film, oxides such as hafnium, zirconium, aluminum, tantalum, titanium, magnesium, yttrium, and lanthanoid can be used as the material of the high-k film.

In step S103, the back end of line (BEOL) is executed. In the BEOL, the wiring 151 in the wiring layer 150 of the pixel 110 is formed. In this step S103, the contact 171 that is connected to the electrode film 133 is formed, and connected to the wiring 151. The structure where a voltage can be applied is formed.

In this step S103, at the point in time when the structure where a voltage can be applied is formed, a voltage may be applied to the fixed charge film 132 to generate a negative fixed charge film, or a voltage may be applied in the later step.

In step S104, the color filter (CF) 112, the OCL 111, and the like are formed.

In this manner, the fixed charge film 132 is formed, and the pixel 110 including the fixed charge film 132 is fabricated. Such steps are examples. The steps may be transposed in the order, or film deposition and the like may be performed by other methods.

As described above, the fixed charge film 132 includes three layers. When the fixed charge film 132 is deposited, heat treatment, especially treatment at high temperatures, is not required. Accordingly, it is possible, for example, to use a metal weak to high temperature for wiling, or to form the fixed charge film 132 after forming such wiring. Hence, it is possible to fabricate the pixel 110 including the fixed charge film 132 without increasing the number of steps. Moreover, it is also possible to prevent a reduction in yield.

The present technology allows forming the fixed charge film 132 with the ONO film, and having a configuration where electrons can be trapped in the charge accumulation layer of the ONO film. Hence, it is possible to prevent occurrence of dark current.

Incidentally, the fixed charge film 132 to which the present technology is applied can also be provided to a vertical spectral pixel, and an avalanche photodiode. The applicable scope is not limited to the above pixel 110.

Other Modifications

Figure 13:
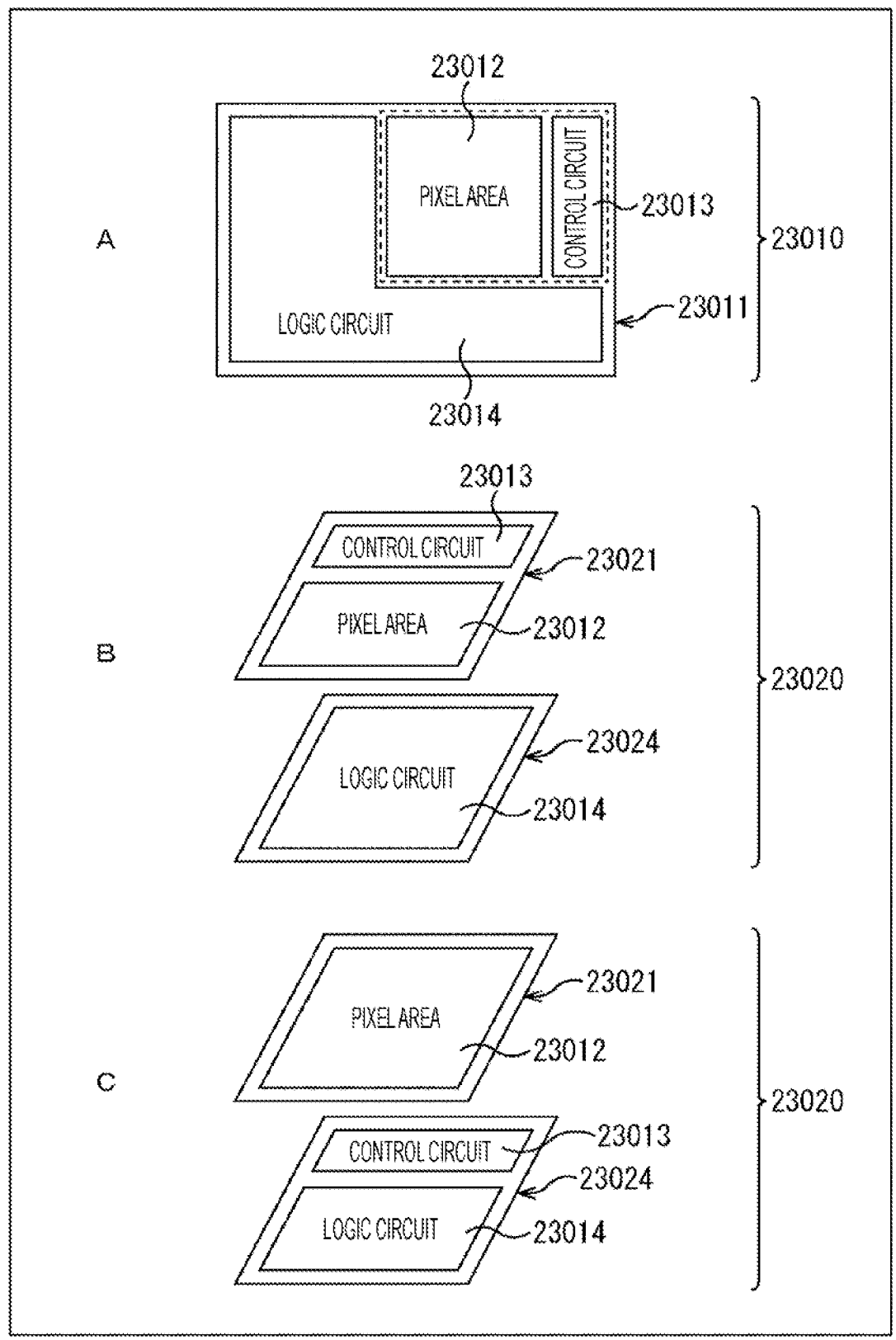
FIG. 13 is a diagram illustrating an overview of configuration examples of a stacked solid-state imaging device to which the technology related to the present disclosure can be applied.

The pixel 110 to which the present technology is applied can also be applied to, for example, a pixel configured by stacking a plurality of substrates as follows:

Configuration Example of Stacked Solid-State Imaging Device to which Technology Related to Present Disclosure can be Applied FIG. 13 is a diagram illustrating an overview of a configuration example of a stacked solid-state imaging device to which the technology related to the present disclosure can be applied.

A of FIG. 13 illustrates a schematic configuration example of a non-stacked solid-state imaging device. A solid-state imaging device 23010 includes one die (semiconductor substrate) 23011 as illustrated in A of FIG. 13. A pixel area 23012 where an array of pixels is placed, a control circuit 23013 that performs drive of the pixels and other various controls, and a logic circuit 23014 for signal processing are mounted on the die 23011.

B and C of FIG. 13 illustrate a schematic configuration example of a stacked solid-state imaging device. As illustrated in B and C of FIG. 13, a solid-state imaging device 23020 is configured as one semiconductor chip by stacking two dies of a sensor die 23021 and a logic die 23024 and electrically connecting the two dies.

In B of FIG. 13, the pixel area 23012 and the control circuit 23013 are mounted on the sensor die 23021. The logic circuit 23014 including a signal processing circuit that performs signal processing is mounted on the logic die 23024.

In C of FIG. 13, the pixel area 23012 is mounted on the sensor die 23021. The control circuit 23013 and the logic circuit 23014 are mounted on the logic die 23024.

Figure 14:
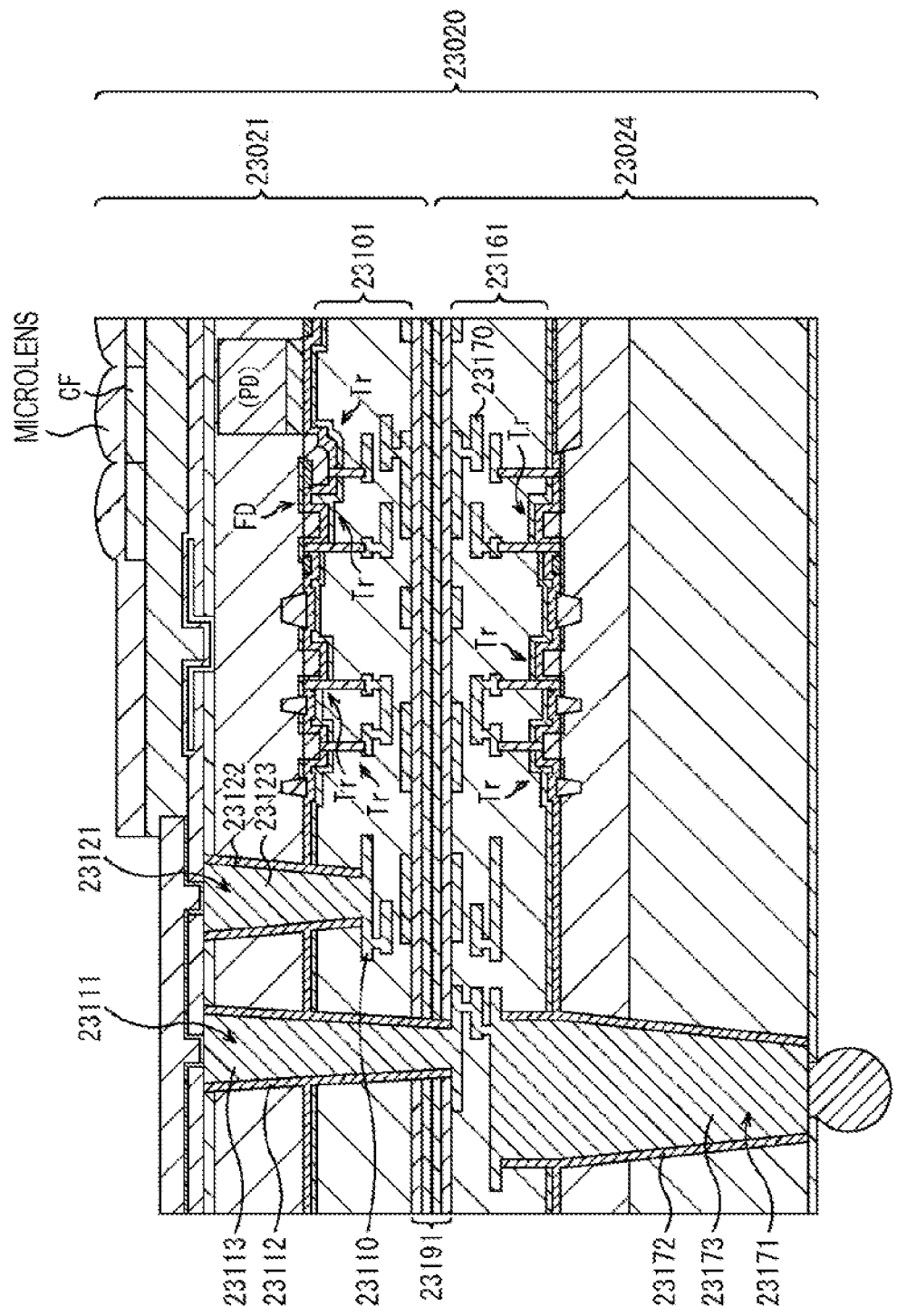
FIG. 14 is a cross-sectional view illustrating a first configuration example of a stacked solid-state imaging device 23020.

FIG. 14 is a cross-sectional view illustrating a first configuration example of the stacked solid-state imaging device 23020.

A photodiode (PD) configuring a pixel to be the pixel area 23012, a floating diffusion (FD), a Tr (MOS FET), a Tr to be the control circuit 23013, and the like are formed on the sensor die 23021. Furthermore, a wiring layer 23101 including wiring 23110 of a plurality of layers, in this example three layers, is formed in the sensor die 23021. Incidentally, (the Tr to be) the control circuit 23013 can be configured not in the sensor die 23021, but in the logic die 23024.

A Tr configuring the logic circuit 23014 is formed in the logic die 23024. Furthermore, a wiring layer 23161 including wiring 23170 of a plurality of layers, in this example three layers, is formed in the logic die 23024. Moreover, a connection hole 23171 having an insulating film 23172 formed an inner wall surface thereof is formed in the logic die 23024. A connection conductor 23173 that is connected to the wiring 23170 and the like is buried in the connection hole 23171.

The sensor die 23021 and the logic die 23024 are pasted together in such a manner that the wiring layers 23101 and 23161 face each other. Consequently, the stacked solid-state imaging device 23020 where the sensor die 23021 and the logic die 23024 are stacked is configured. A film 23151 such as a protective film is formed at a surface where the sensor die 23021 and the logic die 23024 are pasted together.

A connection hole 23111 that penetrates the sensor die 23021 from a back surface side (a side where light enters the PD) (an upper side) of the sensor die 23021 through to the wiring 23170 in the uppermost layer of the logic die 23024 is formed in the sensor die 23021. Furthermore, a connection hole 23121 from the back surface side of the sensor die 23021 through to the wiring 23110 in the first layer is formed in proximity to the connection hole 23111 in the sensor die 23021. An insulating film 23112 is formed on an inner wall surface of the connection hole 23111. An insulating film 23122 is formed on an inner wall surface of the connection hole 23121. Connection conductors 23113 and 23123 are then buried in the connection holes 23111 and 23121, respectively. The connection conductors 23113 and 23123 are electrically connected on the back surface side of the sensor die 23021. Consequently, the sensor die 23021 and the logic die 23024 are electrically connected via the wiring layer 23101, the connection hole 23121, the connection hole 23111, and the wiring layer 23161.

Figure 15:
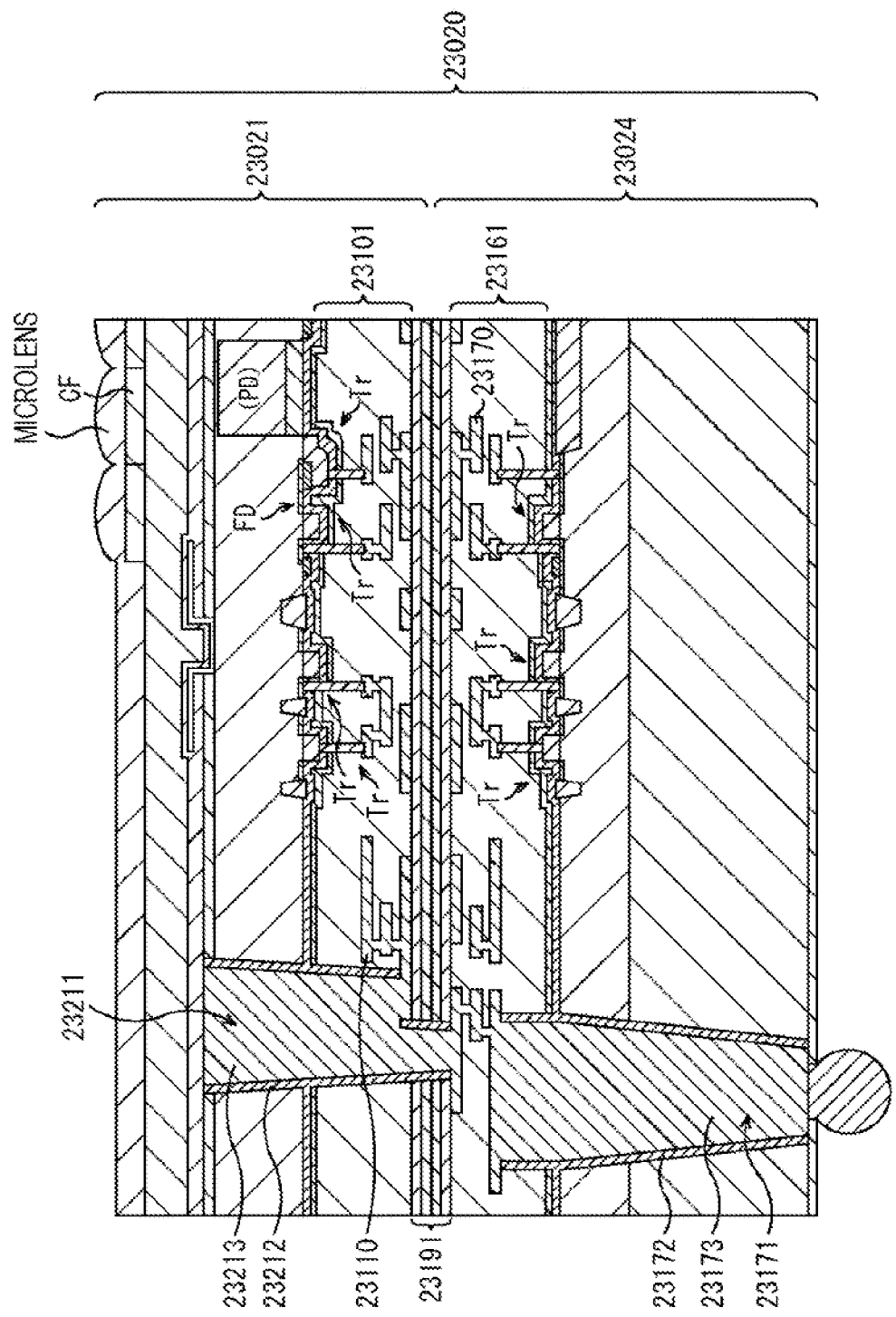
FIG. 15 is a cross-sectional view illustrating a second configuration example of the stacked solid-state imaging device 23020.

FIG. 15 is a cross-sectional view illustrating a second configuration example of the stacked solid-state imaging device 23020.

In the second configuration example of the solid-state imaging device 23020, one connection hole 23211 formed in the sensor die 23021 electrically connects ((the wiring 23110 in) the wiring layer 23101 in) the sensor die 23021, and ((the wiring 23170 in) the wiring layer 23161 in) the logic die 23024.

In other words, in FIG. 15, the connection hole 23211 is formed so as to penetrate the sensor die 23021 from the back surface side of the sensor die 23021 through to the wiring 23170 in the uppermost layer in the logic die 23024 and reach the wiring 23110 in the uppermost layer in the sensor die 23021. An insulating film 23212 is formed on an inner wall surface of the connection hole 23211. A connection conductor 23213 is buried in the connection hole 23211. In FIG. 14 described above, the two connection holes 23111 and 23121 electrically connect the sensor die 23021 and the logic die 23024. However, in FIG. 15, one connection hole 23211 electrically connects the sensor die 23021 and the logic die 23024.

Figure 16:
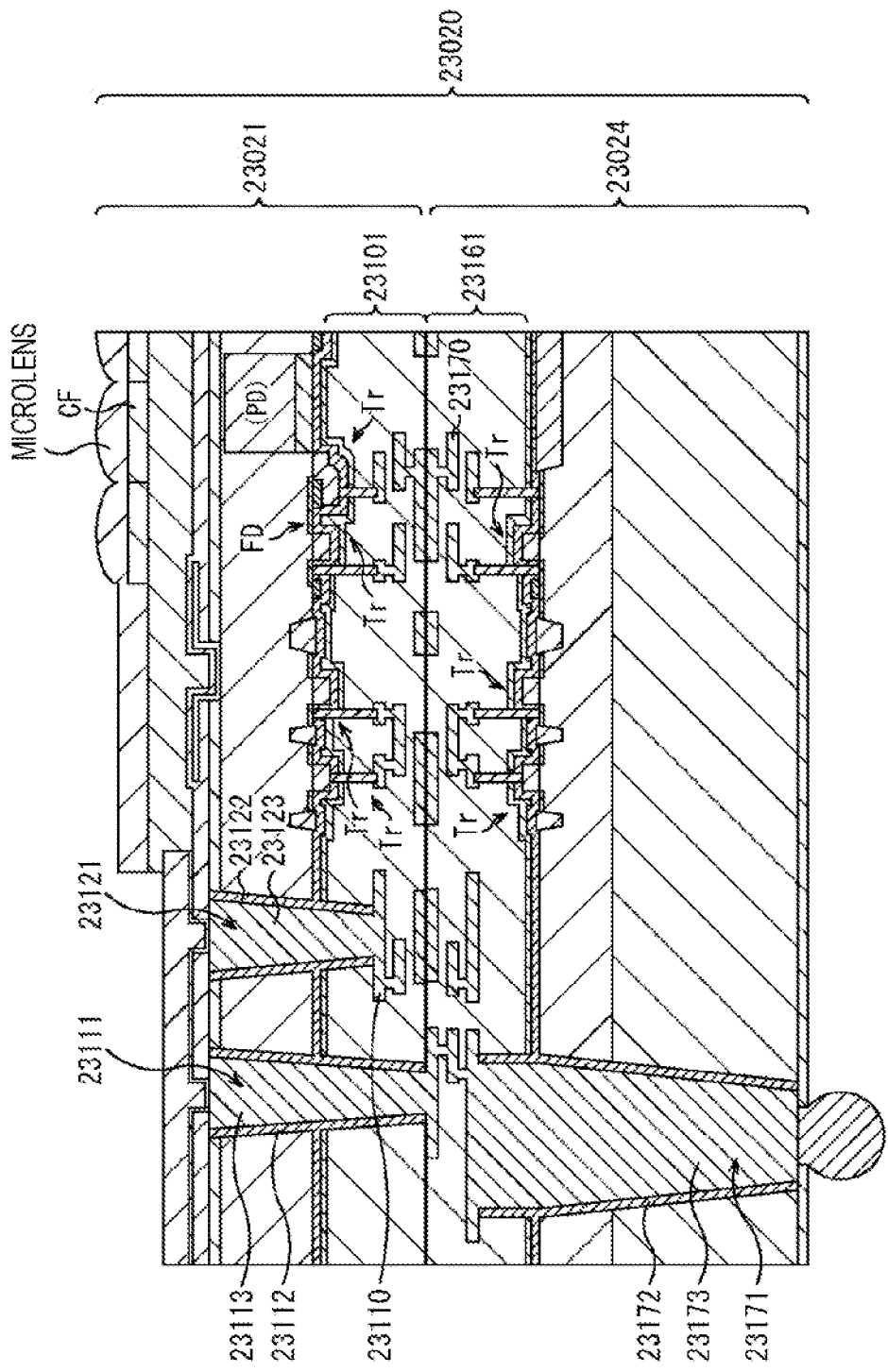
FIG. 16 is a cross-sectional view illustrating a third configuration example of the stacked solid-state imaging device 23020.

FIG. 16 is a cross-sectional view illustrating a third configuration example of the stacked solid-state imaging device 23020.

The solid-state imaging device 23020 in FIG. 16 is different from the case of FIG. 14 where the film 23191 such as a protective film is formed at the surface where the sensor die 23021 and the logic die 23024 are pasted together, in the respect that the film 23191 such as a protective film is not formed at the surface where the sensor die 23021 and the logic die 23024 are pasted together.

The solid-state imaging device 23020 of FIG. 16 is configured by laying the sensor die 23021 and the logic die 23024 on top of each other so as to bring the wirings 73110 and 23170 into direct contact with each other, applying heat while adding a required weight, and directly bonding the wirings 23110 and 23170.

Figure 17:
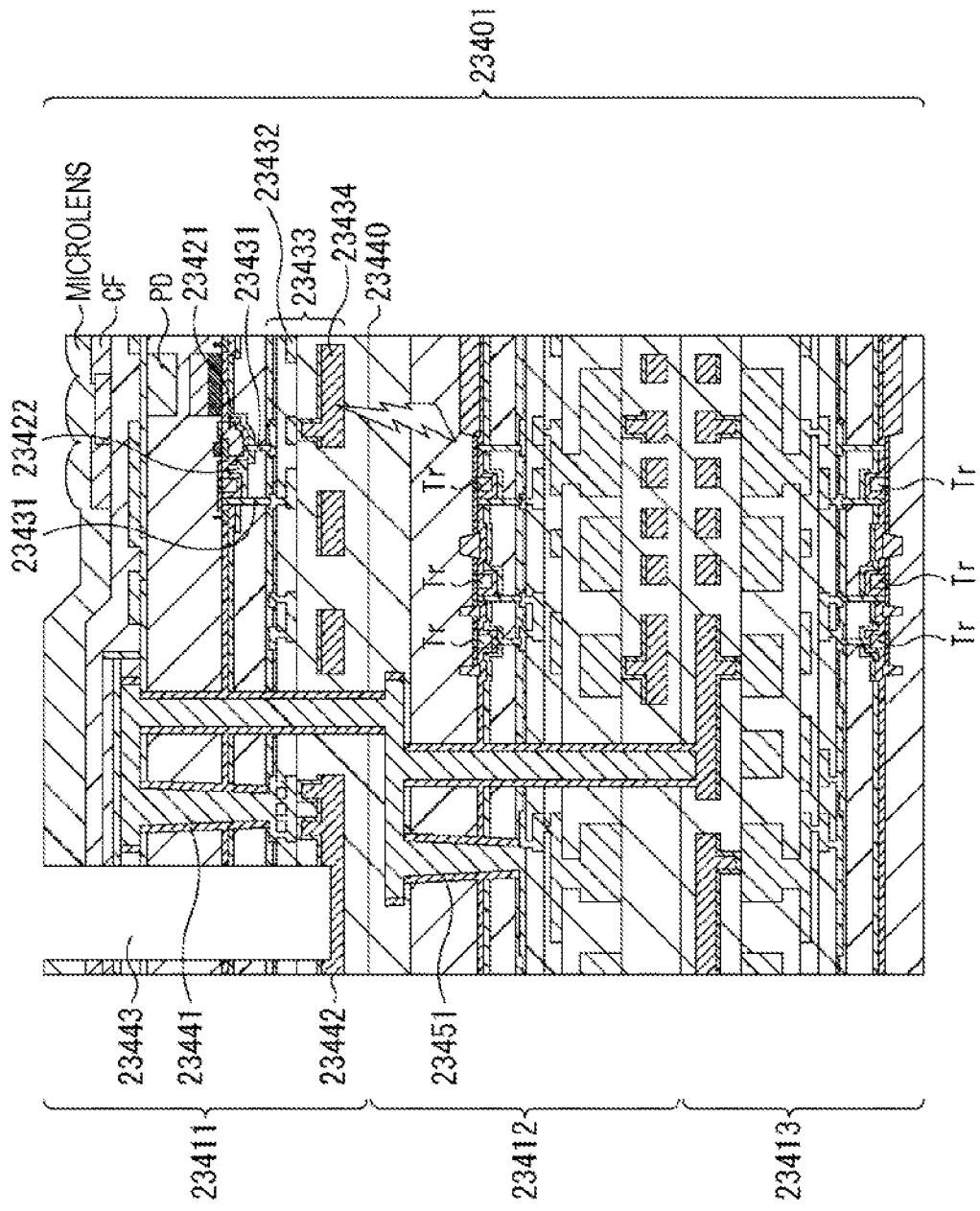
FIG. 17 is a cross-sectional view illustrating another configuration example of the stacked solid-state imaging device to which the technology related to the present disclosure can be applied.

FIG. 17 is a cross-sectional view illustrating another configuration example of the stacked solid-state imaging device to which the technology related to the present disclosure can be applied.

In FIG. 17, a solid-state imaging device 23401 has a three-layer stacked structure Where three dies of a sensor die 23411, a logic die 23412, and a memory die 23413 are stacked.

The memory die 23413 includes, for example, a memory circuit that stores data that is temporarily required in signal processing performed in the logic die 23412.

In FIG. 17, the logic die 23412 and the memory die 23413 are stacked in this order below the sensor die 23411. However, the logic die 23412 and the memory die 23413 can be stacked in reverse order, that is, in the order of the memory die 23413 and the logic die 23412, below the sensor die 23411.

Incidentally, in FIG. 17, a PD to be a photoelectric conversion unit of a pixel, and source and drain regions of a pixel Tr are formed in the sensor die 23411.

A gate electrode is formed around the PD via a gage insulating film. A pixel Tr23421 and a pixel Tr23422 are formed by the gate electrodes and the paired source and drain regions.

The pixel Tr23421 adjacent to the PD is a transfer Tr, and one of the paired source and drain regions configuring the pixel Tr23421 serves as an FD.

Moreover, an interlayer insulating film is formed in the sensor die 23411. A connection hole is formed in the interlayer insulating film. A connection conductor 23431 connected to the pixels Tr23421 and Tr23422 are formed in the connection hole.

Furthermore, a wiring layer 23433 including wiring 23432 of a plurality of layers connected to the connection conductors 23431 is formed in the sensor die 23411.

Moreover, an aluminum pad 23434 to be an electrode for external connection is formed in a lowermost layer of the wiring layer 23433 of the sensor die 23411. In other words, the aluminum pad 23434 is formed at a position closer to a bonding surface 23440 to the logic die 23412 than the wiring 23432, in the sensor die 23411. The aluminum pad 23434 is used as one end of a wire related to the input/output of a signal from/to the outside.

Furthermore, a contact 23441 used for electrical connection to the logic die 23412 is formed in the sensor die 23411. The contact 23441 is connected to a contact 23451 of the logic die 23412, and also connected to an aluminum pad 23442 of the sensor die 23411.

Then, a pad hole 23443 is formed in the sensor die 23411 so as to reach the aluminum pad 23442 from the back surface side (upper side) of the sensor die 23411.

The technology related to the present disclosure can be applied to such a solid-state imaging device as is described above.

Example of Application to Intra-Body Information Acquisition System

The technology related to the present disclosure (the present technology) can be applied to various products. For example, the technology related to the present disclosure may be applied to an endoscopic operation system.

Figure 18:
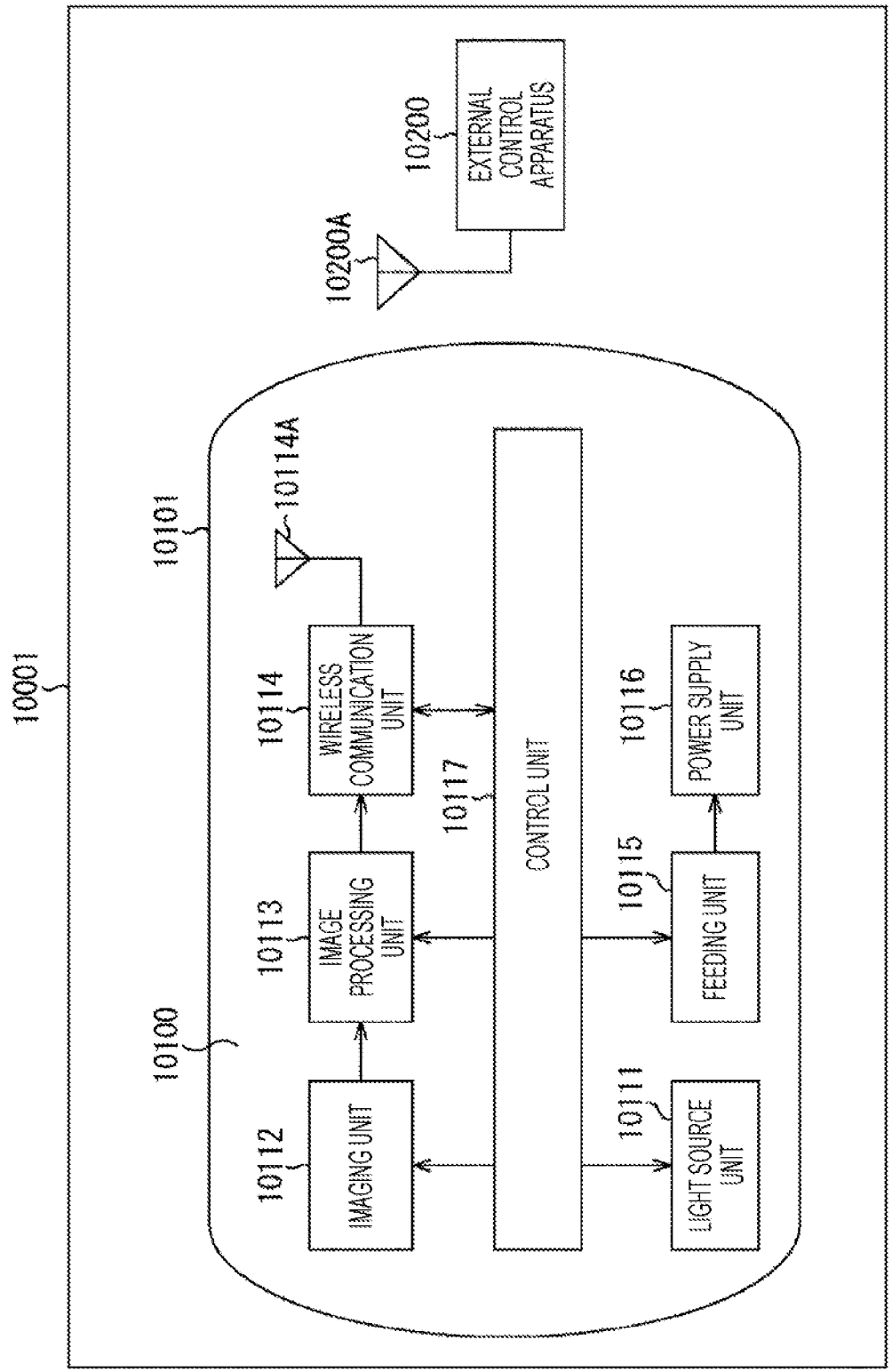
FIG. 18 is a block diagram illustrating an example of a schematic configuration of an intra-body information acquisition system.

FIG. 18 is a block diagram illustrating an example of a schematic configuration of a patient intra-body information acquisition system using a capsule endoscope, to which the technology related to the present disclosure (the present technology) can be applied.

An intra-body information acquisition system 10001 includes a capsule endoscope 10100 and an external control apparatus 10200.

The capsule endoscope 10100 is swallowed by a patient at the time of an examination. The capsule endoscope 10100 has an imaging function and a wireless communication function. The capsule endoscope 10100 captures images of the inside of organs such as the stomach and intestines (hereinafter referred to as intra-body images) sequentially at regular intervals while moving through the organs by peristaltic movement and the like until being naturally excreted from the patient, and transmits the information regarding the intra-body images sequentially and wirelessly to the external control apparatus 10200 outside the body.

The external control apparatus 10200 controls the overall operation of the intra-body information acquisition system 10001. Moreover, the external control apparatus 10200 receives information regarding an intra-body image transmitted from the capsule endoscope 10100, and generates image data for displaying the intra-body image on a display apparatus (not illustrated) on the basis of the received information regarding the intra-body image.

In the intra-body information acquisition system 10001, intra-body images can be obtained by capturing an image of a state inside the body of the patient any time during the period from the swallowing to the excretion of the capsule endoscope 10100.

The configurations and functions of the capsule endoscope 10100 and the external control apparatus 10200 are described in more detail.

The capsule endoscope 10100 includes a capsule-type housing 10101. A light source unit 10111, an imaging unit 10112, an image processing unit 10113, a wireless communication unit 10114, a feeding unit 10115, a power supply unit 10116, and a control unit 10117 are housed in the housing 10101.

The light source unit 10111 includes, for example, a light source such as a light emitting diode (LED), and applies light to the imaging field of view of the imaging unit 10112.

The imaging unit 10112 includes an image pickup device, and an optical system having a plurality of lenses provided upstream of the image pickup device. Reflected light of the light applied to a certain body tissue being an observation target (hereinafter referred to as the observation light) is concentrated by the optical system, and enters the image pickup device. In the image pickup device in the imaging unit 10112, the observation light incident on the image pickup device is converted into electric power to generate an image signal corresponding to the observation light. The image signal generated by the imaging unit 10112 is provided to the image processing unit 10113.

The image processing unit 10113 includes a processor such as a central processing unit (CPU) or graphics processing unit (GPU), and performs various types of signal processing on the image signal generated by the imaging unit 10112. The image processing unit 10113 provides the signal-processed image signal as RAW data to the wireless communication unit 10114.

The wireless communication unit 10114 performs a predetermined process such as a modulation process on the image signal signal-processed by the image processing unit 10113, and transmits the image signal to the external control apparatus 10200 via an antenna 10114A. Moreover, the wireless communication unit 10114 receives a control signal related to control over drive of the capsule endoscope 10100 from the external control apparatus 10200 via the antenna 10114A. The wireless communication unit 10114 provides the control unit 10117 with the control signal received from the external control apparatus 10200.

The feeding unit 10115 includes a power receiving antenna coil, a power regeneration circuit that regenerates electric power from current generated in the antenna coil, a boost converter circuit, and the like. In the feeding unit 10115, the principle of what is called inductive charging is used to generate electric power.

The power supply unit 10116 includes a rechargeable battery, and stores the electric power generated by the feeding unit 10115. In FIG. 1B, a schematic representation of, for example, an arrow indicating a destination of supply of power from the power supply unit 10116 or the like is omitted to avoid the complication of the drawing. However, the power stored in the power supply unit 10116 is supplied to the light source unit 10111, the imaging unit 10112, the image processing unit 10113, the wireless communication unit 10114, and the control unit 10117, and can be used to drive them.

The control unit 10117 includes a processor such as a CPU, and appropriately controls the drive of the light source unit 10111, the imaging unit 10112, the image processing unit 10113, the wireless communication unit 10114, and the feeding unit 10115 in accordance with control signals transmitted from the external control apparatus 10200.

The external control apparatus 10200 includes a processor such as a CPU or CPU, a microcomputer or control board where memory devices such as a processor and memory are combined, or the like. The external control apparatus 10200 transmits a control signal to the control unit 10117 of the capsule endoscope 10100 via the antenna 10200A to control the operation of the capsule endoscope 10100. In the capsule endoscope 10100, for example, a control signal from the external control apparatus 10200 allows changing light application conditions for an observation target in the light source unit 10111. Moreover, the control signal from the external control apparatus 10200 allows changing imaging conditions (for example, a frame rate, an exposure value, and the like in the imaging unit 10112). Moreover, the control signal from the external control apparatus 10200 may allow changing process contents in the image processing unit 10113 and conditions for the wireless communication unit. 10114 to transmit image signals (for example, the transmission interval, the number of images to be transmitted, and the like).

Moreover, the external control apparatus 10200 performs various types of image processing on the image signal transmitted from the capsule endoscope 10100, and generates image data for displaying the captured intra-body image on the display apparatus. As the image processing, various types of signal processing such as a development process (demosaicing process), image enhancement processing (for example, a band boost process, a super-resolution process, a noise reduction (NR) process, and/or a hand-shake correction process), and/or an enlargement process (an electronic zoom process) can be performed. The external control apparatus 10200 controls the drive of the display apparatus, and causes the display apparatus to display an intra-body image captured on the basis of the generated image data. Alternatively, the external control apparatus 10200 may cause a recording apparatus (not illustrated) to record the generated image data therein, or cause a printing apparatus (not illustrated) to print and output the generated image data.

Up to this point an example of the intra-body information acquisition system to which the technology related to the present disclosure can be applied has been described. The technology related to the present disclosure can be applied to the imaging unit 10112 among the configurations described above.

Example of Application to Mobile Object

The technology related to the present disclosure (the present technology) can be applied to various products. For example, the technology related to the present disclosure may be realized as an apparatus mounted on any type of mobile object such as an automobile, an electric vehicle, a hybrid electric vehicle, a motorcycle, a bicycle, a personal mobility, an airplane, a drone, a ship, or a robot.

Figure 19:
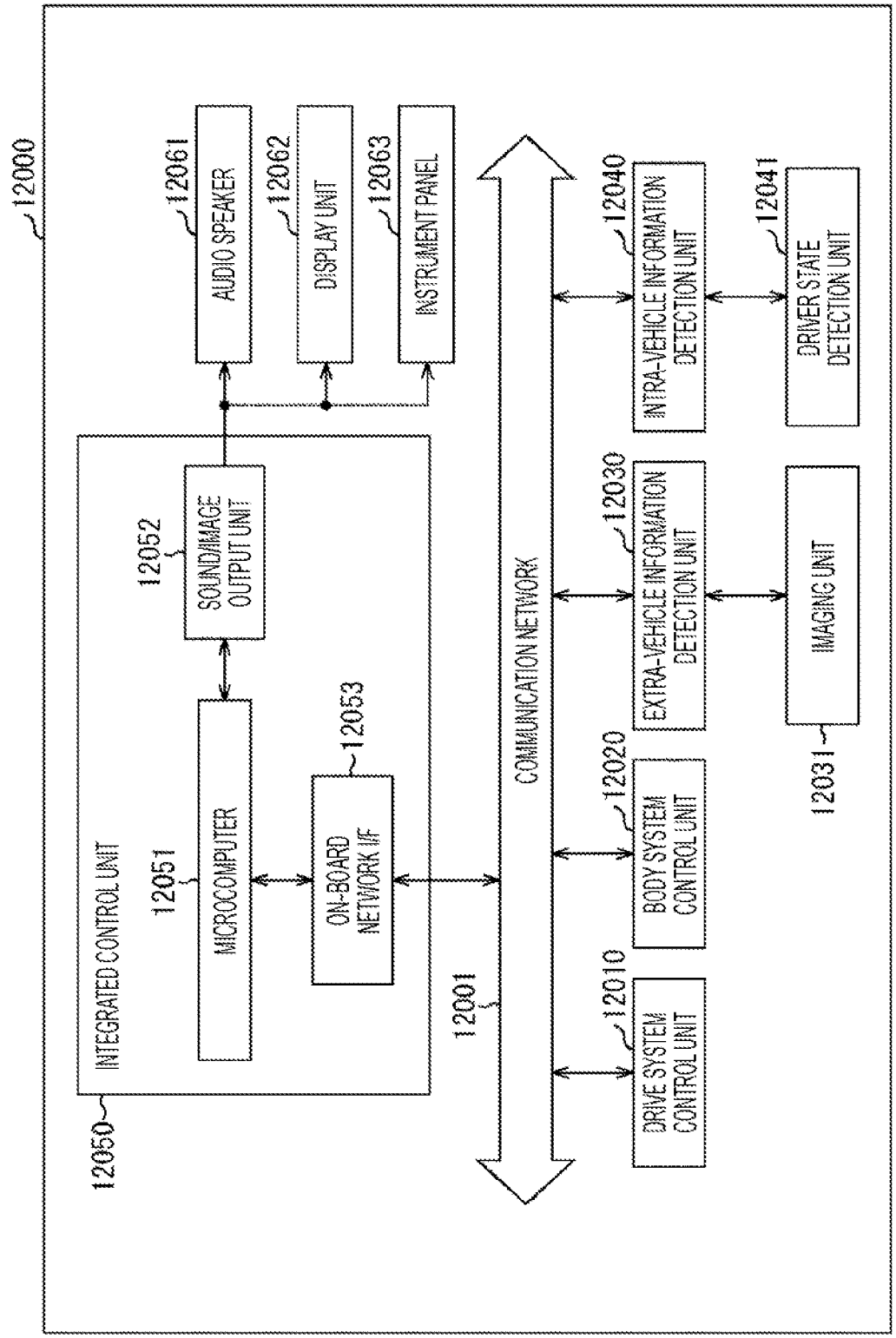
FIG. 19 is a block diagram illustrating an example of a schematic configuration of a vehicle control system.

FIG. 19 is a block diagram illustrating a schematic configuration example of a vehicle control system being an example of a mobile object control system to which the technology related to the present disclosure can be applied. A vehicle control system 12000 includes a plurality of electronic control units connected via a communication network 12001. In the example illustrated in FIG. 19, the vehicle control system 12000 includes a drive system control unit 12010, a foody system control unit 12020, an extra-vehicle information detection unit 12030, an intra-vehicle information detection unit 12040, and an integrated control unit 12050. Moreover, as the functional configuration of the integrated control unit 12050, a microcomputer 12051, a sound/image output unit 12052, an on-board network interface (I/F) 12053 are depicted.

The drive system control unit 12010 controls the operation of an apparatus related to a vehicle drive system in accordance with various programs. For example, the drive system control unit 12010 functions as control apparatuses such as a drive power generating apparatus for generating vehicle drive power such as an internal combustion engine or drive motor, a drive power transmission mechanism for transmitting the drive power to the wheels, a steering mechanism that adjusts the steering angle of the vehicle, and a brake apparatus for generating a braking force of the vehicle.

The body system control unit 12020 controls the operation of various apparatuses provided to the vehicle in accordance with various programs. For example, the body system control unit 12020 functions as a control apparatus of a keyless entry system, a smart key system, a power window apparatus, or various lamps such as a headlamp, a backup lamp, a stop lamp, a turn signal, or a fog lamp. In this case, radio waves emitted from a mobile machine substituted for a key or various switch signals can be inputted into the body system control unit 12020. The body system control unit 12020 accepts the input of the radio wave or signal and controls a door lock apparatus, the power window apparatus, the lamp, or the like of the vehicle.

The extra-vehicle information detection unit 12030 detects information regarding the outside of the vehicle where the vehicle control system 12000 is mounted. For example, the imaging unit 12031 is connected to the extra-vehicle information detection unit 12030. The extra-vehicle information detection unit 12030 causes the imaging unit 12031 to capture an image of the outside of the vehicle, and also receives the captured image. The extra-vehicle information detection unit 12030 may perform an object detection process or distance detection process on a person, a car, an obstacle, a sign, characters on a road surface, or the like on the basis of the received image.

The imaging unit 12031 is an optical sensor that receives light and outputs an electrical signal in accordance with the amount of the received light. The imaging unit 12031 can output the electrical signal as an image or can output the electrical signal as distance-measuring information. Moreover, the light received by the imaging unit 12031 may be visible light or invisible light such as infrared light.

The intra-vehicle information detection unit 12040 detects information regarding the inside of the vehicle. For example, a driver state detection unit 12041 that detects the state of a driver is connected to the intra-vehicle information detection unit 12040. The driver state detection unit 12041 includes, for example, a camera that captures an image of the driver. The intra-vehicle information detection unit 12040 may calculate the level of fatigue or concentration of the driver on the basis of the detected information inputted from the driver state detection unit 12041, or may distinguish between whether or not the driver is dozing.

The microcomputer 12051 can compute a control target value of the drive power generating apparatus, the steering mechanism, or the brake apparatus on the basis of information regarding the inside or outside of the vehicle acquired by the extra-vehicle information detection unit 12030 or the intra-vehicle information detection unit 12040, and output a control command to the drive system control unit 12010. For example, the microcomputer 12051 can perform coordinated control with the objective of realizing the function of an advanced driver assistance system (ADAS) including collision avoidance or shock mitigation of the vehicle, tracking control based on a distance from the vehicle ahead, a vehicle-speed maintenance travel, a vehicle collision warning, a vehicle lane departure warning, or the like.

Moreover, the microcomputer 12051 can perform coordinated control with the objective of, for example, automated driving for travelling autonomously irrespective of operation by the driver and the like by controlling the drive power generating apparatus, the steering mechanism, the brake apparatus, or the like on the basis of information regarding the surroundings of the vehicle acquired by the extra-vehicle information detection unit 12030 or the intra-vehicle information detection unit 12040.

Moreover, the microcomputer 12051 can output a control command to the body system control unit 12020 on the basis of information regarding the outside of the vehicle acquired by the extra-vehicle information detection unit 12030. For example, the microcomputer 12051 can perform coordinated control with the objective of promoting prevention of glare, for example, controlling the headlamp in accordance with the position of the vehicle ahead or the oncoming vehicle detected by the extra-vehicle information detection unit 12030, switching from the high beam to the low beam, and the like.

The sound/image output unit 12052 transmits an output signal of at least one of a sound or image to an output apparatus that can visually or auditorily notify an occupant of the vehicle or the outside of the vehicle of information. In the example of FIG. 19, an audio speaker 12061, a display unit 12062, and an instrument panel 12063 are illustrated by example as the output apparatuses. The display unit 12062 may include, for example, at least one of an on-board display or a head-up display.

Figure 20:
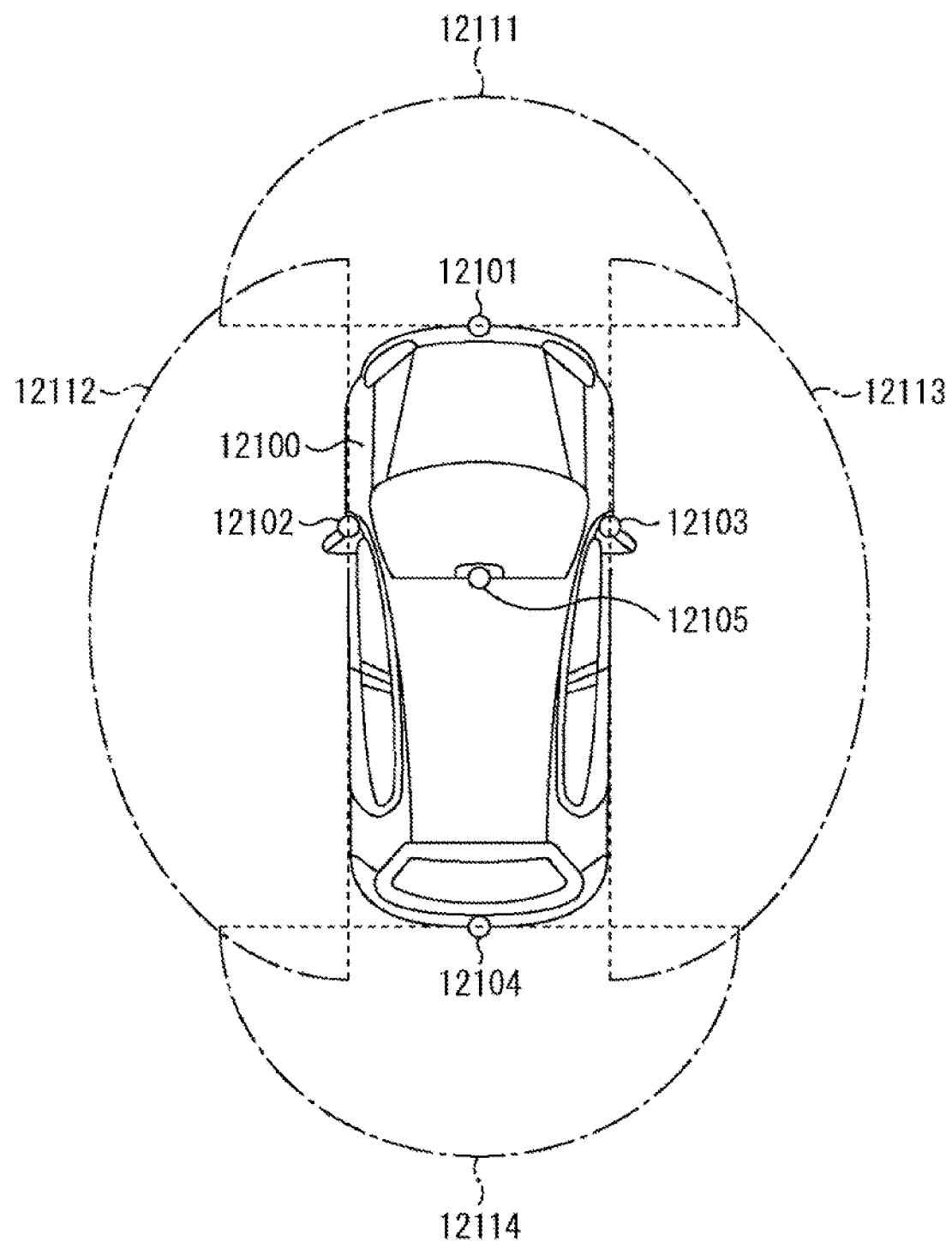
FIG. 20 is an explanatory diagram illustrating an example of the installation positions of an extra-vehicle information detection unit and an imaging unit.

FIG. 20 is a diagram illustrating an example of the installation position of the imaging unit 12031.

In FIG. 20, a vehicle 12100 includes imaging units 12101, 12102, 12103, 12104, and 12105 as the imaging unit 12031.

The imaging units 12101, 12102, 12103, 12104, and 12105 are provided at positions of, for example, the front nose, the side mirrors, the rear bumper, the back door, the top of the windshield in the cabin of the vehicle 12100, and the like. The imaging unit 12101 provided to the front nose and the imaging unit 12105 provided to the top of the windshield in the cabin mainly acquire images ahead of the vehicle 12100. The imaging units 12102 and 12103 provided to the side mirrors mainly acquire images to the sides of the vehicle 12100. The imaging unit 12104 provided to the rear bumper or the back door mainly acquires images behind the vehicle 12100. The forward images acquired by the imaging units 12101 and 12105 are mainly used to detect, for example, the vehicle ahead, or pedestrians, obstacles, traffic lights, traffic signs, lanes, or the like.

Incidentally, FIG. 20 illustrates examples of imaging areas of the imaging units 12101 to 12104. An imaging area 12111 indicates the imaging area of the imaging unit 12101 provided to the front nose. Imaging areas 12112 and 12113 indicate the imaging areas of the imaging units 12102 and 12103 provided to the side mirrors, respectively. An imaging area 12114 indicates the imaging area of the imaging unit 12104 provided to the rear bumper or backdoor. For example, image data captured by the imaging units 12101 to 12104 is superimposed to obtain an overhead image of the vehicle 12100 as viewed from above.

At least one of the imaging units 12101 to 12104 may have a function of acquiring distance information. For example, at least one of the imaging units 12101 to 12104 may be a stereo camera including a plurality of image pickup devices, or may be an image pickup device having a pixel for phase difference detection.

For example, the microcomputer 12051 obtains a distance to each three-dimensional object in the imaging areas 12111 to 12114, and a temporal variation in the distance (the speed relative to the vehicle 12100) on the basis of distance information obtained from the imaging units 12101 to 12104, and accordingly can extract especially a three-dimensional object closest on a travel path of the vehicle 12100, the three-dimensional object travelling at a predetermined speed (for example, 0 km/h or greater) in substantially the same direction as the vehicle 12100, as the vehicle ahead. Furthermore, the microcomputer 12051 can set a distance from the vehicle ahead that should be secured in advance behind the vehicle ahead, and perform, for example, automatic brake control (including tracking stop control), automatic acceleration control (including tracking start control), and the like. In this manner, it is possible to perform coordinated control with the objective of, for example, automated driving for travelling autonomously irrespective of operation by the driver, and the like.

For example, the microcomputer 12051 can classify three-dimensional object data related to the three-dimensional object into two-wheel vehicle, standard-size car, large-size car, pedestrian, pole, other three-dimensional objects, or the like on the basis of the distance information obtained from the imaging units 12101 to 12104 and extracts the data, and use the data to automatically avoid the obstacle. For example, the microcomputer 12051 distinguishes an obstacle around the vehicle 12100 between an obstacle that the driver of the vehicle 12100 can perceive and an obstacle that is difficult for the driver to perceive. The microcomputer 12051 then judges a collision risk indicating the level of risk of collision with each obstacle and, when the collision risk is equal to or greater than a set value, and it is a situation with a possibility of collision, outputs a warning to the driver via the audio speaker 12061 or the display unit 12062, or forces a reduction in speed or steers to avoid the collision via the drive system control unit 12010. Accordingly, it is possible to provide driving assistance for collision avoidance.

At least one of the imaging units 12101 to 12104 may be an infrared camera that detects infrared radiation. For example, the microcomputer 12051 can recognize a pedestrian by determining whether or not a pedestrian exists in images captured by the imaging units 12101 to 12104. Such recognition of the pedestrian is gained by, for example, a procedure for extracting features in images captured by the imaging units 12101 to 12104 as infrared cameras, and a procedure for performing a pattern matching process on a string of features indicating the contour of an object and distinguishing whether or not the object is a pedestrian. If the microcomputer 12051 determines that a pedestrian exists in the images captured by the imaging units 12101 to 12104, and recognizes the pedestrian, the sound/image output unit 12052 controls the display unit 12062 so as to superimpose and display a square contour for enhancement on the recognized pedestrian. Moreover, the sound/image output unit 12052 may control the display unit 12062 so as to display, for example, an icon and the like indicating the pedestrian at a desired position.

Up to this point an example of the vehicle control system to which the technology related to the present disclosure can be applied has been described. The technology related to the present disclosure can be applied to, for example, the imaging unit 12031 and the like among the configurations described above.

Incidentally, an embodiment of the present technology is not limited to the above-mentioned embodiment, and various modifications can be made thereto within the scope that does not depart from the spirit of the present technology.

The present technology can also employ the following configurations:

(1) An image pickup device including:
 a photoelectric conversion unit configured to perform a photoelectric conversion;
 a trench engraved in a semiconductor substrate;
 a negative fixed charge film having an oxide film, a nitrogen film, and an oxide film on a side wall of the trench; and
 an electrode film formed in the fixed charge film.

(2) The image pickup device according to the (1),
 in which the oxide film configuring the fixed charge film includes silicon monoxide (SiO), and
 the nitrogen film includes silicon nitride (SiN).

(3) The image pickup device according to the (1) or (2),
 in which the nitrogen film configuring the fixed charge film includes a polysilicon film or a high dielectric constant film (high-k film).

(4) The image pickup device according to any of the (1) to (3),
 in which the nitrogen film configuring the fixed charge film includes a film using any of materials: silicon nitride, hafnium, zirconium, aluminum, tantalum, titanium, magnesium, yttrium, and lanthanoid.

(5) The image pickup device according to any of the (1) to (4), further including:
 wiring connected to a power supply that applies a voltage; and
 a contact Connecting the wiring and the electrode film.

(6) The image pickup device according to any of the (1) to (4), further including:
 a light shielding film formed on a light receiving surface side of the photoelectric conversion unit; and
 a contact connecting the light shielding film and the electrode film.

(7) The image pickup device according to any of the (1) to (6),
in which the trench does not penetrate the semiconductor substrate.
(8) The image pickup device according to the (5),
in which the contact is formed for each pixel.
(9) The image pickup device according to the (5),
in which the contact is shared by a plurality of pixels.
(10) The image pickup device according to any of the (1) to (9),
in which the trench is formed so as to surround a pixel, and is formed in a partially disconnected state.
(11) An electronic apparatus equipped with an image pickup device, in which the image pickup device includes:
a photoelectric conversion unit configured to perform a photoelectric conversion;
a trench engraved in a semiconductor substrate;
a negative fixed charge film having an oxide film, a nitrogen film, and an oxide film on a side wall of the trench; and
an electrode film formed in the fixed charge film.

REFERENCE SIGNS LIST

10 Imaging device
11 Lens group
12 Image pickup device
13 DSP circuit
14 Frame memory
15 Display unit
16 Recording unit
17 Operation system
18 Power supply system
19 Bus line
20 CPU
31 Pixel
33 Vertical signal line
41 Pixel array unit
42 Vertical drive unit
43 Column processing unit
44 Horizontal drive unit
45 System control unit
46 Pixel drive line
47 Vertical signal line
48 Signal processing unit
49 Data storage unit
101 Incident light
110 Pixel
111 Microlens
113 Planarization film
114 Light shielding film
115 Insulating film
116 p-type semiconductor region
117 Light receiving surface
118 Semiconductor substrate
120 n-type semiconductor region
130 Pixel isolation portion
131 Trench
132 Fixed charge film
133 Electrode film
141 p-type semiconductor region
150 Wiring layer
151 Wiring
152 Insulating layer
161 Support substrate
171 Contact
190 Transfer transistor
192 Reset transistor
193 Amplifier transistor
194 Select transistor
201 SiO film
202 SiN film
203 SiO film

What is claimed is:

1. An image pickup device, comprising:
a photoelectric conversion unit configured to perform a photoelectric conversion;
a trench engraved in a semiconductor substrate;
a fixed charge film including a first oxide film, a nitrogen film, and a second oxide film on a side wall of the trench; and
an electrode film formed in and in contact with the fixed charge film,
wherein a thickness of the first oxide film is thinner than a thickness of the second oxide film, and
wherein the nitrogen film is provided continuously between the first and second oxide films, the second oxide film is provided closest to the electrode film and the first oxide film is provided closest to the side wall of the trench.

2. The image pickup device according to claim 1, wherein each of the first and second oxide films configuring the fixed charge film includes silicon monoxide (SiO), and the nitrogen film includes silicon nitride (SiN).

3. The image pickup device according to claim 1, wherein the nitrogen film configuring the fixed charge film includes a polysilicon film or a high dielectric constant film (high-k film).

4. The image pickup device according to claim 1, wherein the nitrogen film configuring the fixed charge film includes a film using any of materials: silicon nitride, hafnium, zirconium, aluminum, tantalum, titanium, magnesium, yttrium, and lanthanoid.

5. The image pickup device according to claim 1, further comprising:
a wiring connected to a power supply that applies a voltage; and
a contact connecting the wiring and the electrode film.

6. The image pickup device according to claim 1, further comprising:
a light shielding film formed on a light receiving surface side of the photoelectric conversion unit; and
a contact connecting the light shielding film and the electrode film.

7. The image pickup device according to claim 1, wherein the trench does not penetrate the semiconductor substrate.

8. The image pickup device according to claim 5, wherein the contact is formed for each pixel.

9. The image pickup device according to claim 5, wherein the contact is shared by a plurality of pixels.

10. The image pickup device according to claim 1, wherein the trench is formed so as to partially surround a pixel.

11. An electronic apparatus equipped with an image pickup device, wherein the image pickup device comprises:
a photoelectric conversion unit configured to perform a photoelectric conversion;
a trench engraved in a semiconductor substrate;
a fixed charge film including a first oxide film, a nitrogen film, and
a second oxide film on a side wall of the trench; and
an electrode film formed in and in contact with the fixed charge film, wherein a thickness of the first oxide film is thinner than a thickness of the second oxide film, and wherein the nitrogen film is provided continuously between the first and second oxide films, the second oxide film is provided closest to the electrode film and the first oxide film is provided closest to the side wall of the trench.

12. The electronic apparatus according to claim 11, wherein each of the first and second oxide films configuring the fixed charge film includes silicon monoxide (SiO), and the nitrogen film includes silicon nitride (SiN).

13. The electronic apparatus according to claim 11, wherein the nitrogen film configuring the fixed charge film includes a polysilicon film or a high dielectric constant film (high-k film).

14. The electronic apparatus according to claim 11, wherein the nitrogen film configuring the fixed charge film includes a film using any of materials: silicon nitride, hafnium, zirconium, aluminum, tantalum, titanium, magnesium, yttrium, and lanthanoid.

15. The electronic apparatus according to claim 11, further comprising:
   a wiring connected to a power supply that applies a voltage; and
   a contact connecting the wiring and the electrode film.

16. The electronic apparatus according to claim 11, further comprising:
   a light shielding film formed on a light receiving surface side of the photoelectric conversion unit; and
   a contact connecting the light shielding film and the electrode film.

17. The electronic apparatus according to claim 11, wherein the trench does not penetrate the semiconductor substrate.

18. The electronic apparatus according to claim 15, wherein the contact is formed for each pixel.

19. The electronic apparatus according to claim 15, wherein the contact is shared by a plurality of pixels.

20. The electronic apparatus according to claim 11, wherein the trench is formed so as to partially surround a pixel.

* * * * *